United States Patent
Kwon et al.

(10) Patent No.: US 10,138,318 B2
(45) Date of Patent: Nov. 27, 2018

(54) BLOCK COPOLYMER AND METHOD OF MANUFACTURING INTEGRATED CIRCUIT DEVICE USING THE SAME

(71) Applicant: Samsung Electronics Co., Ltd., Suwon-si, Gyeonggi-do (KR)

(72) Inventors: Seungchul Kwon, Suwon-si (KR); Jeongju Park, Hwaseong-si (KR); Shi-yong Yi, Seongnam-si (KR); Eun Sung Kim, Seoul (KR); Kyeongmi Lee, Suwon-si (KR); Joona Bang, Seoul (KR); Sanghoon Woo, Seoul (KR)

(73) Assignees: KOREA UNIVERSITY RESEARCH AND BUSINESS FOUNDATION, Seongbuk-Gu (KR); SAMSUNG ELECTRONICS CO., LTD, Gyeonggi-Do (KR)

(*) Notice: Subject to any disclaimer, the term of this patent is extended or adjusted under 35 U.S.C. 154(b) by 144 days.

(21) Appl. No.: 15/225,201

(22) Filed: Aug. 1, 2016

(65) Prior Publication Data

US 2017/0107317 A1    Apr. 20, 2017

(30) Foreign Application Priority Data

Oct. 19, 2015 (KR) .......................... 10-2015-0145431

(51) Int. Cl.
| | |
|---|---|
| *C08F 12/20* | (2006.01) |
| *C08F 293/00* | (2006.01) |
| *H01L 21/027* | (2006.01) |
| *G03F 7/00* | (2006.01) |
| *B82Y 40/00* | (2011.01) |

(52) U.S. Cl.
CPC ........ *C08F 293/005* (2013.01); *G03F 7/0002* (2013.01); *H01L 21/0271* (2013.01); *B82Y 40/00* (2013.01); *C08F 12/20* (2013.01); *C08F 2438/03* (2013.01)

(58) Field of Classification Search
CPC .............................. C08F 12/20; C08F 2438/03
See application file for complete search history.

(56) References Cited

U.S. PATENT DOCUMENTS

| | | | |
|---|---|---|---|
| 5,241,007 A * | 8/1993 | Han .................... | C08L 25/18 |
| | | | 525/176 |
| 8,334,089 B2 | 12/2012 | Yi et al. | |
| 8,512,846 B2 | 8/2013 | Millward | |
| 8,974,678 B2 | 3/2015 | Millward | |
| 8,993,088 B2 | 3/2015 | Millward et al. | |
| 9,005,877 B2 | 4/2015 | Rathsack et al. | |
| (Continued) | | | |

FOREIGN PATENT DOCUMENTS

| | | | |
|---|---|---|---|
| WO | WO-0042084 A1 * | 7/2000 | ........... C08F 293/005 |

OTHER PUBLICATIONS

Riedel et al. European Polymer Journal 47, 675-684 (Year: 2011).*

(Continued)

*Primary Examiner* — Mark S Kaucher
(74) *Attorney, Agent, or Firm* — Harness, Dickey & Pierce, PLC

(57) ABSTRACT

A block copolymer includes a first polymer block and a second polymer block having different structures, and one of the first polymer block and the second polymer block has a halogen-substituted structure.

15 Claims, 32 Drawing Sheets

(56) References Cited

U.S. PATENT DOCUMENTS

| | | |
|---|---|---|
| 9,040,429 B2 | 5/2015 | Kato et al. |
| 2006/0182752 A1 | 8/2006 | Kohn et al. |
| 2013/0029113 A1 | 1/2013 | Nealey et al. |
| 2014/0197132 A1 | 7/2014 | Kang et al. |
| 2014/0273361 A1 | 9/2014 | Arnold et al. |
| 2016/0155967 A1 | 6/2016 | Lee et al. |
| 2016/0163547 A1 | 6/2016 | Kim et al. |

OTHER PUBLICATIONS

Fu et al. Advanced Functional Materials 15, 315-322 (Year: 2005).*
D. Pospiech et al. "Determination of interaction parameters of block copolymers containing aromatic polyesters from solubility parameters obtained from solution viscosities" Colloid Plum Sci (2002) 280; 1027-1037.
B. Rathsack et al. "Pattern Scaling with Directed Self Assembly Through Lithography and Etch Process Integration" Alternative Lithographic Technologies IV, vol. 8323, 83230B © 2012 SPIE.

\* cited by examiner

B - B'

B - B'

B - B'

B - B'

BLOCK COPOLYMER AND METHOD OF MANUFACTURING INTEGRATED CIRCUIT DEVICE USING THE SAME

CROSS-REFERENCE TO RELATED APPLICATION

This application claims the benefit of Korean Patent Application No. 10-2015-0145431, filed on Oct. 19, 2015, in the Korean Intellectual Property Office, the disclosure of which is incorporated herein in its entirety by reference.

BACKGROUND

1. Field

Example embodiments of the inventive concepts relate to a block copolymer and a method of manufacturing an integrated circuit device using the same, and more particularly, to a block copolymer having an increased effective dispersity (Ð eff) of a polymer material and a method of manufacturing an integrated circuit device, which is capable of forming fine patterns by using the block copolymer.

2. Description of the Related Art

As semiconductor devices have been highly integrated, an area occupied by each unit cell has become smaller when seen in a plan view. In response to a reduction in the area of the unit cell, a design rule of a critical dimension (CD) having a nanoscale of several to tens of nanometers is applied.

SUMMARY

Example embodiments of the inventive concepts provide a block copolymer having a structure capable of improving phase separation characteristics by increasing an effective dispersity when a plurality of fine hole patterns are repeatedly formed at a relatively large pitch of about 50 nm or more by using a directed self-assembly (DSA) technology.

Example embodiments of the inventive concepts provide a method capable of forming fine patterns to be used in an integrated circuit device, the fine patterns having an improved CD uniformity by providing improved phase separation characteristics and improved vertical alignment characteristics when a plurality of fine hole patterns are repeatedly formed at a relatively large pitch of about 50 nm or more by using a DSA technology.

According to example embodiments of the inventive concepts, a block copolymer includes a first polymer block and a second polymer block having different structures, and one of the first polymer block and the second polymer block has a halogen-substituted structure.

The first polymer block and the second polymer block may have different solubility parameters, and one of the first polymer block and the second polymer block having the halogen-substituted structure has a smaller solubility parameter.

The first polymer block may include a repeating unit derived from acrylic ester, and the second polymer block may include a repeating unit having a halogen-substituted aromatic group.

A ratio of the first polymer block to the second polymer block may be in the range of about 6:4 to about 8:2.

The first polymer block may include a repeating unit derived from acrylic ester, and the second polymer block may include a repeating unit derived from styrene or a derivative of the styrene having at least one of a hydrogen atom at an α position of the styrene and at least one a hydrogen atom in a substituent at an α position of the derivative of styrene substituted with a halogen atom.

The block copolymer may include a structure of the following Formula (1):

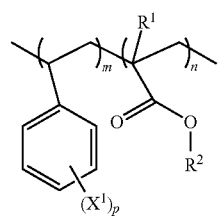

Formula (1)

wherein
$X^1$ is a halogen atom,
p is an integer from 1 to 5,
each of $R^1$ and $R^2$ is one of a hydrogen atom, a $C_1$-$C_5$ straight-chain or branched alkyl group, and a $C_1$-$C_5$ alkyl halide group, and $m/(m+n)$=0.6 to 0.8.

The block copolymer may further include a random block copolymer connecting the first polymer block and the second polymer block, the random block copolymer having at least two repeating units that are randomly copolymerized.

The random block copolymer may be expressed by the following Formula (2):

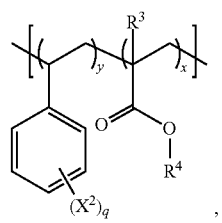

Formula (2)

wherein
$X^2$ is a halogen atom,
q is an integer from 1 to 5,
each of $R^3$ and $R^4$ is one of a hydrogen atom, a $C_1$-$C_5$ straight-chain or branched alkyl group, and a $C_1$-$C_5$ alkyl halide group, and $x/(x+y)$=0.2 to 0.8.

The block copolymer may further include a first end group connected to the first polymer block and a second end group connected to the second polymer block, wherein one of the first end group and the second end group may include at least one of a dithioester end group and a trithiocarbonate end group.

One of the first end group and the second end group may include at least one of a hydrogen atom, a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid, a phosphate, a substituted or unsubstituted $C_1$-$C_{40}$ alkyl group, a substituted or unsubstituted $C_1$-$C_{40}$ alkoxy group, a substituted or unsubstituted $C_7$-$C_{40}$ aryl group, a substituted or unsubstituted $C_6$-$C_{40}$ aryloxy group, a substituted or unsubstituted $C_2$-$C_{40}$ alkenyl group, a substituted or unsubstituted $C_1$-$C_{40}$ alkylamino group, a substituted or unsubstituted $C_6$-$C_{40}$ arylamino group, a substituted or unsubstituted $C_3$-$C_{20}$ alkylsilyl group, a substituted or unsubstituted $C_8$-$C_{40}$ arylsilyl group, a substituted or unsubstituted $C_7$-$C_{40}$ ketoaryl group, a substituted or unsubstituted $C_7$-$C_{40}$ ketoheteroaryl group, a substituted or unsubstituted $C_1$-$C_{40}$ haloalkyl group, a $C_1$-$C_{40}$ fused aliphatic ring, a fused aromatic ring, a fused heteroaliphatic ring, and a fused heteroaromatic ring.

According to example embodiments of the inventive concepts, a block copolymer includes a first polymer block having a first solubility parameter, and a second polymer block having a second solubility parameter less than the first solubility parameter and including a halogen-substituted structure.

The first polymer block may include a repeating unit derived from acrylic ester, and the second polymer block may include a repeating unit including a halogen-substituted aromatic group.

The block copolymer may include a structure of the following Formula (1):

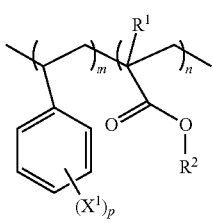

Formula (1)

wherein
$X^1$ is a halogen atom,
p is an integer from 1 to 5,
each of $R^1$ and $R^2$ is one of a hydrogen atom, a $C_1$-$C_5$ straight-chain or branched alkyl group, and a $C_1$-$C_5$ alkyl halide group, and $m/(m+n)$=0.6 to 0.8.

The block copolymer may include a structure of the following Formula (3):

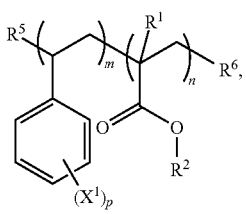

Formula (3)

wherein
$X^1$ is a halogen atom,
p is an integer from 1 to 5,
each of $R^1$ and $R^2$ is one of a hydrogen atom, a $C_1$-$C_5$ straight-chain or branched alkyl group, and a $C_1$-$C_5$ alkyl halide group,
$R^5$ is a sulfur-containing functional group expressed by —S—(C=S)—R', where R' is one of a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, or a substituted or unsubstituted $C_6$-$C_{10}$ aryl group, $R^6$ is a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group, and $m/(m+n)$=0.6 to 0.8.

The block copolymer may further include a random block copolymer connecting the first polymer block and the second polymer block, the random block copolymer having at least two repeating units that are randomly copolymerized.

The random block copolymer may be expressed by the following Formula (4):

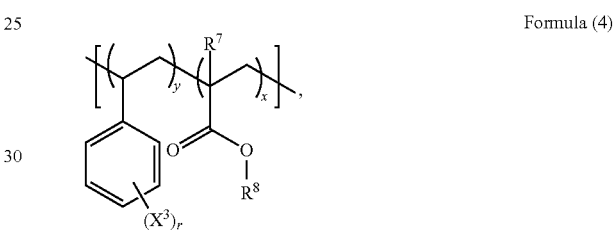

Formula (4)

wherein
$X^3$ is a halogen atom,
r is an integer from 1 to 5,
each of $R^7$ and $R^8$ is one of a hydrogen atom, a $C_1$-$C_5$ straight-chain or branched alkyl group, and a $C_1$-$C_5$ alkyl halide group, and $x/(x+y)$=0.2 to 0.8.

The random block copolymer may have a molecular weight of about 1 kg/mol to about 15 kg/mol.

The block copolymer may include a structure of the following Formula (5):

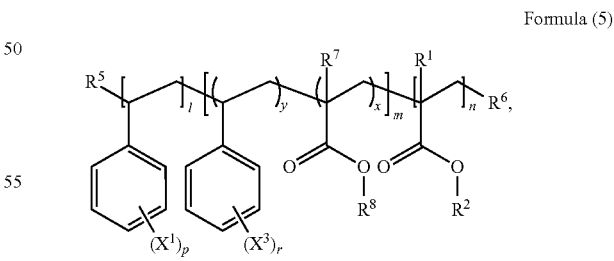

Formula (5)

wherein
each of $X^1$ and $X^3$ is a halogen atom,
each of p and r is an integer from 1 to 5,
each of $R^1$, $R^2$, $R^7$, and $R^8$ is one of a hydrogen atom, a $C_1$-$C_5$ straight-chain or branched alkyl group, or a $C1$-$C_5$ alkyl halide group, and $R^5$ is a sulfur-containing functional group expressed by —S—(C=S)—R', where R' is a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, or a substituted or unsubstituted $C_6$-$C_{10}$ aryl group, $R^6$ is a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group, $l/(l+m+n)=0.6$ to $0.8$, $m/(l+m+n)=0.01$ to $0.15$, and $x/(x+y)=0.2$ to $0.8$.

The block copolymer may have a molecular weight of about 80 kg/mol to about 100 kg/mol and a polydispersity of about 1.2 or more.

Each of the first polymer block and the second polymer block may include at least one of repeating units derived from substituted or unsubstituted acrylic ester, substituted or unsubstituted styrene or a derivative thereof, substituted or unsubstituted alkylene oxide, and substituted or unsubstituted isoprene.

According to example embodiments of the inventive concepts, a method includes forming a block copolymer layer on a feature layer, the block copolymer layer including a block copolymer, the block copolymer including a first polymer block having a first solubility parameter and a second polymer block having a second solubility parameter less than the first solubility parameter, and the second polymer block having a halogen-substituted structure, forming a plurality of first domains and a second domain by phase-separating the block copolymer layer, the plurality of first domains including the first polymer block and being regularly arranged, and the second domain including the second polymer block and surrounding each of the plurality of first domains, removing the plurality of first domains, and forming a plurality of holes in the feature layer by etching the feature layer by using the second domain as an etching mask.

The block copolymer may include a structure of the following Formula (3):

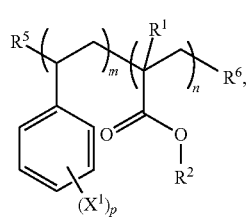

Formula (3)

wherein
X$^1$ is a halogen atom,
p is an integer from 1 to 5,
each of $R^1$ and $R^2$ is one of a hydrogen atom, a $C_1$-$C_5$ straight-chain or branched alkyl group, or a $C_1$-$C_5$ alkyl halide group, $R^5$ is a sulfur-containing functional group expressed by —S—(C=S)—R', where R' is a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, or a substituted or unsubstituted $C_6$-$C_{10}$ aryl group, $R^6$ is a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group, and $m/(m+n)=0.6$ to $0.8$.

The block copolymer may further include a first end group connected to the first polymer block and a second end group connected to the second polymer block, and each of the first end group and the second end group may include a sulfur-containing functional group expressed by one of —S—(C=S)—R' (where R' is one of a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, and a substituted or unsubstituted $C_6$-$C_{10}$ aryl group), a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group.

The block copolymer may further include a random block copolymer connecting the first polymer block and the second polymer block and including at least two repeating units that are randomly copolymerized.

The random block copolymer may have a molecular weight of about 1 kg/mol to about 15 kg/mol.

The block copolymer may include a structure of the following Formula (5):

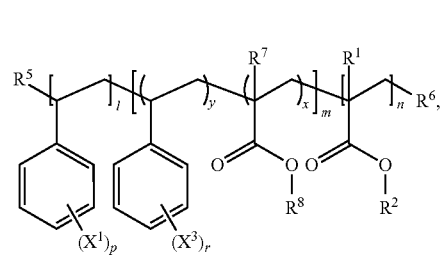

Formula (5)

wherein
each of $X^1$ and $X^3$ is a halogen atom,
each of p and r is an integer from 1 to 5, each of $R^1$, $R^2$, $R^7$, and $R^8$ is one of a hydrogen atom, a $C_1$-$C_5$ straight-chain or branched alkyl group, and a $C_1$-$C_5$ alkyl halide group, and $R^5$ is a sulfur-containing functional group expressed by —S—(C=S)—R', where R' is one of a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, or a substituted or unsubstituted $C_6$-$C_{10}$ aryl group, $R^6$ is a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group, $$l/(l+m+n)=0.6 \text{ to } 0.8,$$

$$m/(l+m+n)=0.01 \text{ to } 0.15, \text{ and}$$

$$x/(x+y)=0.2 \text{ to } 0.8.$$

The block copolymer may have a molecular weight of about 80 kg/mol to about 100 kg/mol and a polydispersity of about 1.2 or more.

The first polymer block may include at least one of poly(methyl methacrylate) (PMMA), poly(ethylene oxide) (PEO), poly(lactic acid) (PLA), and polyisoprene (PI), and the second polymer block may include poly(fluorinated styrene) (PFS).

The plurality of first domains may be formed to be arranged in a hexagonal array.

The plurality of first domains may be regularly arranged at a pitch of about 50 nm or more.

According to example embodiments of the inventive concepts, a block copolymer includes a first polymer block including at least one of poly(methyl methacrylate) (PMMA), poly(ethylene oxide) (PEO), poly(lactic acid) (PLA), and polyisoprene (PI), and a second polymer block including a halogen-substituted styrene.

The first polymer block may be PMMA, and the second polymer block may be poly(fluorinated styrene) (PFS).

The second polymer block may have a smaller solubility parameter than the first polymer block.

The block copolymer may further include a random block copolymer connecting the first polymer block and the second polymer block, the random block copolymer having at least two repeating units that are randomly copolymerized.

The block copolymer may further include a first end group connected to the first polymer block and a second end group connected to the second polymer block, and one of the first end group and the second end group may include at least one of a dithioester end group and a trithiocarbonate end group.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

Figure 1:
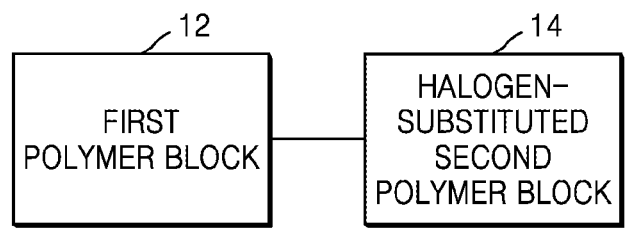
FIG. 1 is a schematic block diagram of a block copolymer according to example embodiments.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION

Hereinafter, example embodiments will be described in detail with reference to the accompanying drawings. In the drawings, like reference numbers are used to refer to like elements and redundant descriptions thereof will be omitted.

Example embodiments may be embodied in many different forms and should not be construed as being limited to example embodiments set forth herein; rather, these embodiments are provided so that this disclosure will be thorough and complete, and will fully convey the inventive concepts to those of ordinary skill in the art. Expressions such as "at least one of" when preceding a list of elements, modify the entire list of elements and do not modify the individual elements of the list.

Also, though terms "first", "second", etc. are used to describe various members, components, regions, layers, and/or portions in various embodiments of the inventive concepts, the members, components, regions, layers, and/or portions are not limited to these terms. These terms do not mean a specific order, an up-and-down order, or superiority and are used only to differentiate one member, component, region, layer, or portion from another one. Therefore, a first member, a first component, a first region, a first layer, or a first portion in an example embodiment may refer to a second member, a second component, a second region, a second layer, or a second portion in another example embodiment. For example, a first element may be referred to as a second element without departing from the scope of the inventive concepts. Similarly, a second element may be referred to as a first element.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

In the accompanying drawings, the modifications of the illustrated shapes may be expected according to manufacturing technologies and/or tolerance. Therefore, example embodiments should not be construed as being limited to specific shapes of the illustrated regions. The shapes may be changed during the manufacturing processes. The term "substrate" used herein may mean a substrate itself or a stack structure including a substrate and a given or predetermined layer or film formed thereon. Also, the expression "surface of a substrate" may mean an exposed surface of the substrate or an external surface of a given or predetermined layer or film formed thereon.

In this specification, the term "substituted" may mean that a hydrogen atom in a compound is substituted with a substituent selected from a halogen atom, a hydroxyl group, an alkoxy group, a nitro group, a cyano group, an amidino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid, a phosphate, a $C_1$-$C_{20}$ alkyl group, a $C_2$-$C_{20}$ alkenyl group, a $C_2$-$C_{20}$ alkynyl group, a $C_6$-$C_{30}$ aryl group, a $C_7$-$C_{30}$ arylalkyl group, a $C_1$-$C_4$ alkoxy group, a $C_1$-$C_{20}$ heteroalkyl group, a $C_3$-$C_{20}$ heteroaryl-alkyl group, a $C_3$-$C_{30}$ cycloalkyl group, a $C_3$-$C_{15}$ cycloalkenyl group, a $C_6$-$C_{15}$ cycloalkynyl group, a $C_2$-$C_{20}$ heterocycloalkyl group, and combinations thereof.

The term "$C_1$-$C_{20}$ alkyl group" may mean a straight-chain or branched, substituted or unsubstituted alkyl group, which has about 1 to about 20 carbon atoms. Examples of the alkyl group may include at least one selected from methyl, ethyl, ethenyl, ethinyl, n-propyl, isopropyl, n-butyl, isobutyl, sec-butyl, t-butyl, butenyl, isobutenyl, butynyl, n-pentyl, n-hexyl, n-heptyl, and n-octyl, but are not limited thereto.

The term "$C_3$-$C_{30}$ cycloalkyl group" may mean an alkyl group that includes at least one selected from cyclohexyl, cyclopentyl, and cyclopropyl. The alkyl group may be a straight-chain or branched alkyl group that has about 1 to about 6 carbon atoms.

The term "$C_7$-$C_{30}$ arylalkyl group" may mean substituted or unsubstituted $C_7$-$C_{30}$ aromatic hydrocarbon. Examples of the $C_7$-$C_{30}$ arylalkyl group may include at least one selected from phenyl, naphthyl, anthracenyl, phenanthrenyl, and fluorenyl, but are not limited thereto.

The term "halogen-substituted styrene" may mean that at least one of hydrogen atoms at the α position of styrene or at least one of hydrogen atoms in a substituent at the α position of a derivative of the styrene is substituted with a halogen atom. Examples of the halogen atom may include at least one selected from fluorine (F), chlorine (Cl), bromine (Br), and iodine (I).

The term "PDI" or "D" may be a polydispersity of a block copolymer, which is determined according to an equation of PDI=MW/MN (where MW is a number average molecular weight of the block copolymer, and MN is a weight-average molecular weight of the block copolymer).

FIG. 1 is a schematic diagram of a block copolymer 10 according to example embodiments.

Referring to FIG. 1, the block copolymer 10 according to example embodiments may include a first polymer block 12 and a second polymer block 14, which have different structures.

One selected from the first polymer block 12 and the second polymer block 14 may have a halogen-substituted structure. In example embodiments, the first polymer block 12 and the second polymer block 14 may have different solubility parameters. One of the first polymer block 12 and the second polymer block 14, which has a smaller solubility parameter, may have the halogen-substituted structure.

A solubility parameter difference between the first polymer block 12 and the second polymer block 14 may affect a Flory-Huggins interaction parameter χ of the block copolymer 10. For example, as the solubility parameter difference between the first polymer block 12 and the second polymer block 14 becomes larger, the Flory-Huggins interaction parameter χ of the block copolymer 10 may further increase.

More specifically, in a case where fine patterns are formed by a directed self-assembly (DSA) technology using the block copolymer 10, a line edge roughness (LER) of the fine patterns, which affects a critical dimension (CD) uniformity of fine patterns to be formed, may be determined by an interfacial width between polymer blocks on a boundary between a first domain including the first polymer block 12 and a second domain including the second polymer block 14 of a product obtained after phase separation of the block copolymer 10. The interfacial width may be determined by a Flory-Huggins interaction parameter χ between the first polymer block 12 and the second polymer block 14, according to the following Equation 1:

$$\text{Interfacial Width} = 2a(6\chi)^{-1/2}, \quad \text{[Equation 1]}$$

where "a" is a statistical segment length of a polymer chain including the first polymer block 12 and the second polymer block 14 and is a proportionality constant.

In the block copolymer 10, increasing the Flory-Huggins interaction parameter χ so as to further decrease the interfacial width may be desirable. A Flory-Huggins interaction parameter $\chi_{AB}$ between two polymer blocks A and B may be affected by a solubility parameter difference $\delta_A$-$\delta_B$ between the two polymer blocks A and B, according to the following Equation 2:

$$\chi_{AB} = (V/RT)/(\delta_A - \delta_B), \quad \text{[Equation 2]}$$

where V is a molar volume of a reference unit, R is a gas constant, and T is an absolute temperature.

That is, as the solubility parameter difference between the first polymer block 12 and the second polymer block 14 increases, the Flory-Huggins interaction parameter χ between the first polymer block 12 and the second polymer block 14 may increase. Accordingly, the Flory-Huggins interaction parameter χ between the first polymer block 12 and the second polymer block 14 may further increase by increasing the solubility parameter difference between the first polymer block 12 and the second polymer block 14, so that the interface width of the block copolymer 10 may further decrease. Therefore, improving the LER and the CD uniformity of the fine patterns formed by the DSA technology using the block copolymer 10 may be possible.

According to the block copolymer 10 according to example embodiments, in order to further increase the solubility parameter difference between the first polymer block 12 and the second polymer block 14, one of the first polymer block 12 and the second polymer block 14, which has the smaller solubility parameter, may have the halogen-substituted structure.

In example embodiments, the first polymer block 12 may include a repeating unit derived from acrylic ester. The second polymer block 14 may include a repeating unit that includes a halogen-substituted aromatic group. For example, the first polymer block 12 may include poly(methyl methacrylate (PMMA), and the second polymer block 14 may include halogen-substituted polystyrene (PS). A solubility parameter of PMMA may be about 19.0 MPA$^{1/2}$, and a solubility parameter of PS may be about 18.5 MPA$^{1/2}$. In the block copolymer 10 according to example embodiments, the second polymer block 14 may include the halogen-substituted PS instead of the PS whose solubility parameter is less than the solubility parameter of the PMMA included in the first polymer block 12. Because the halogen atom is introduced to the PS, further decreasing the solubility parameter of the second polymer block 14 including the halogen-substituted PS may be possible. Therefore, in a block copolymer including PMMA-b-PS, the solubility parameter difference between the first polymer block 12 and the second polymer block 14 may become greater than the solubility parameter difference between the PMMA and the PS. As a result, obtaining the block copolymer 10 having a Flory-Huggins interaction parameter $\chi$ that is greater than a Flory-Huggins interaction parameter $\chi$ of the PMMA-b-PS may be possible.

In addition, the block copolymer 10 according to example embodiments may have a polydispersity (PDI) that is greater than a polydispersity (PDI) of a block copolymer having a common structure with a preset molecular weight. In example embodiments, a molecular weight of the block copolymer 10 may be in the range of about 80 kg/mol to about 100 kg/mol. The block copolymer 10 having a molecular weight within the range may have a polydispersity of about 1.2 or more.

Figure 2:
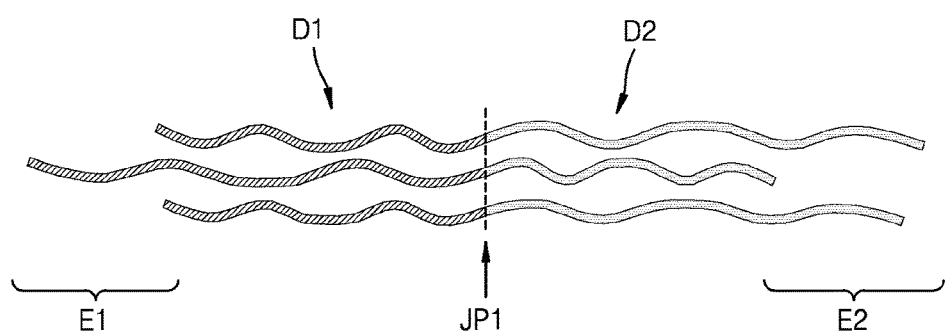
FIG. 2 is a schematic diagram of a self-assembly layer obtained after phase separation of a block copolymer, according to example embodiments.

FIG. 2 is a schematic diagram of a self-assembly layer obtained after phase separation of the block copolymer 10 illustrated in FIG. 1. FIG. 2 is a diagram of polymer chains including a first domain D1 that includes the first polymer block 12 and a second domain D2 that includes the second polymer block 14.

In FIG. 2, a dotted line may represent a junction point JP1 between the first domain D1 and the second domain D2.

As illustrated in FIG. 2, because the block copolymer 10 according to example embodiments has a relatively large polydispersity, a length of each of the polymer chains may be various in the self-assembly layer obtained after the phase separation of the block copolymer 10, the polymer chains including the first domain D1 that includes the first polymer block 12 and the second domain D2 that includes the second polymer block 14. End portions of the polymer chains may not be placed at a constant position, but be distributed throughout wide ranges E1 and E2 in each of the first domain D1 and the second domain D2. Therefore, in order to constantly maintain a whole density of the phase-separated block copolymer 10, stretching energy, which is generated by a two-dimensional deformation of the polymer chains, may be decreased in the first domain D1 and the second domain D2. As a result, interface energy may be decreased on an interface between the first domain D1 and the second domain D2. In addition, when fine patterns including a plurality of contact holes are formed by using the self-assembly layer including the first domain D1 and the second domain D2, a pitch of the plurality of contact holes may be increased.

Each of the first polymer block 12 and the second polymer block 14 illustrated in FIG. 1 may include at least one selected from repeating units derived from substituted or unsubstituted acrylic ester, substituted or unsubstituted styrene or a derivative thereof, substituted or unsubstituted alkylene oxide, and substituted or unsubstituted isoprene, but a repeating unit included in each of the first polymer block 12 and the second polymer block 14 is not limited thereto.

In example embodiments, the first polymer block 12 of the block copolymer 10 illustrated in FIG. 1 may include a repeating unit derived from acrylic ester. The second polymer block 14 may include a repeating unit that includes a halogen-substituted aromatic group. Examples of the halogen atom may include at least one selected from F, Cl, Br, and I.

In example embodiments, a ratio of the first polymer block 12 to the second polymer block 14 may be in the range of about 6:4 to about 8:2.

For example, the first polymer block 12 may include at least one selected from repeating units derived from acrylic esters (e.g., methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate). Alternatively, the first polymer block 12 may include at least one selected from repeating units derived from methacrylic esters (e.g., methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxyphenyl methacrylate, benzyl methacrylate, anthracene methacrylate, glycidyl methacrylate, 3,4-epoxycyclohexylmethane methacrylate, and propyltrimethoxysilane methacrylate).

In example embodiments, the second polymer block 14 may include a repeating unit derived from styrene or a derivative of the styrene, in which at least one of hydrogen atoms at the $\alpha$ position of the styrene or at least one of hydrogen atoms in a substituent at the $\alpha$ position of the derivative of the styrene is substituted with a halogen atom.

For example, the second polymer block 14 may include at least one repeating unit selected from halogen-substituted styrene, halogen-substituted $\alpha$-methylstyrene, halogen-substituted 2-methylstyrene, halogen-substituted 3-methylstyrene, halogen-substituted 4-methylstyrene, halogen-substituted 4-t-butylstyrene, halogen-substituted 4-n-octylstyrene, halogen-substituted 2,4,6-trimethylstyrene, halogen-substituted 4-methoxystyrene, halogen-substituted 4-t-butoxystyrene, halogen-substituted 4-hydroxystyrene, halogen-substituted 4-nitrostyrene, halogen-substituted 3-nitrostyrene, halogen-substituted 4-chlorostyrene, halogen-substituted 4-fluorostyrene, halogen-substituted 4-acetoxyvinylstyrene, halogen-substituted 4-vinylbenzylchloride, halogen-substituted 1-vinylnaphthalene, halogen-substituted 4-vinylbiphenyl, halogen-substituted 1-vinyl-2-pyrrolidone, halogen-substituted 9-vinylanthracene, and halogen-substituted vinylpyridine.

In example embodiments, the block copolymer 10 may be a PFS-b-PMMA block copolymer including at least one selected from poly(fluorinated styrene) (PFS) and poly(methyl methacrylate) (PMMA). In this case, the block copolymer 10 may include a structure of the following Formula (1):

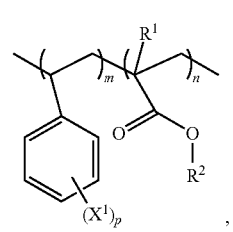

Formula (1)

wherein $X^1$ is a halogen atom, p is an integer from 1 to 5, each of $R^1$ and $R^2$ is one of a hydrogen atom, a $C_1$-$C_5$ straight-chain or branched alkyl group, and a $C_1$-$C_5$ alkyl halide group, and m/(m+n)=0.6 to 0.8.

The $C_1$-$C_5$ alkyl halide group may be a group in which a portion or the whole of hydrogen atoms in a $C_1$-$C_5$ alkyl group is substituted with a halogen atom. Examples of the halogen atom may include at least one selected from F, Cl, Br, and I. For example, each of $R^1$ and $R^2$ of Formula (1) may include at least one selected from a methyl group, an ethyl group, a propyl group, an isopropyl group, an n-butyl group, an isobutyl group, a tert-butyl group, a pentyl group, an isopentyl group, and a neopentyl group.

Figure 3:
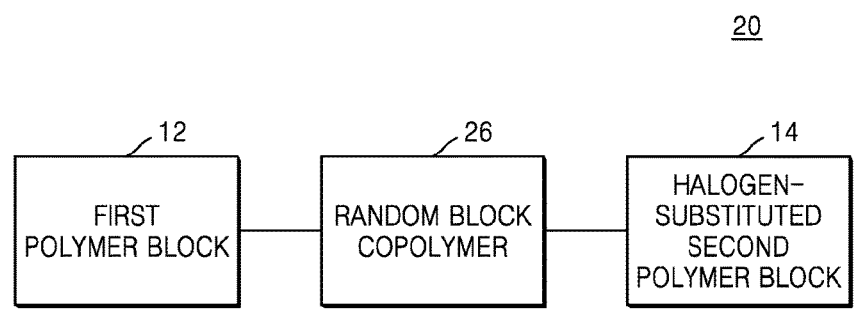
FIG. 3 is a schematic block diagram of a block copolymer according to example embodiments.

FIG. 3 is a schematic block diagram of a block copolymer 20 according to embodiments. In FIG. 3, like reference numbers as illustrated in FIG. 1 are used to refer to like elements, and redundant descriptions thereof will be omitted.

Referring to FIG. 3, the block copolymer 20 may include a first polymer block 12, a second polymer block 14, and a random block copolymer 26 which is connected between the first polymer block 12 and the second polymer block 14 and in which at least two repeating units are randomly copolymerized.

The random block copolymer 26 may include two polymer blocks having different solubility parameters. One of the two polymer blocks, which has a smaller solubility parameter, has a halogen-substituted structure.

In example embodiments, the random block copolymer 26 may be expressed by the following Formula (2):

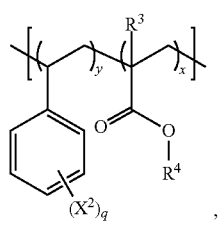

Formula (2)

wherein $X^2$ is a halogen atom, q is an integer from 1 to 5, each of $R^3$ and $R^4$ is one of a hydrogen atom, a $C_1$-$C_5$ straight-chain or branched alkyl group, and a $C_1$-$C_5$ alkyl halide group, and $x/(x+y)$ is =0.6 to 0.8.

For example, each of $R^3$ and $R^4$ of Formula (2) may include at least one selected from a methyl group, an ethyl group, a propyl group, an isopropyl group, an n-butyl group, an isobutyl group, a tert-butyl group, a pentyl group, an isopentyl group, and a neopentyl group.

Figure 4:
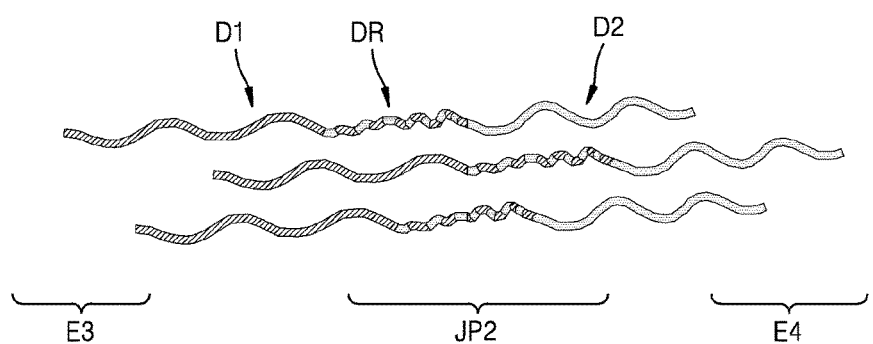
FIG. 4 is a schematic diagram of a self-assembly layer obtained after phase separation of a block copolymer, according to example embodiments.

FIG. 4 is a schematic diagram of a self-assembly layer obtained after phase separation of the block copolymer 20 illustrated in FIG. 3. FIG. 4 is a diagram of polymer chains including a first domain D1 that includes the first polymer block 12, a second domain D2 that includes the second polymer block 14, and a random block DR that includes the random block copolymer 26.

Because the block copolymer 20 illustrated in FIG. 3 includes the random block copolymer 26 between the first polymer block 12 and the second polymer block 14, an effective dispersity (Đ eff) of the block copolymer 20 may be further increased. In the self-assembly layer obtained after the phase separation of the block copolymer 20, a length of each of the polymer chains may be various, the polymer chains including the first domain D1 that includes the first polymer block 12 and the second domain D2 that includes the second polymer block 14. Therefore, end portions of the polymer chains may not be placed at a constant position, but be distributed throughout wide ranges E3 and E4 in each of the first domain D1 and the second domain D2. In addition, as illustrated in FIG. 4, because the random block copolymer 26 is connected between the first domain D1 and the second domain D2, a junction region JP2 between the first domain D1 and the second domain D2 may be widened. Therefore, in a similar manner to be described with reference to FIG. 2, in order to constantly maintain a whole density of the phase-separated block copolymer 20, stretching energy, which is generated by a two-dimensional deformation of the polymer chains, may be decreased in the first domain D1 and the second domain D2. As a result, interface energy may be decreased between the first domain D1 and the second domain D2. Therefore, when fine patterns including a plurality of contact holes are formed by using the self-assembly layer including the first domain D1, the second domain D2, and the random block DR between the first domain D1 and the second domain D2, a pitch of the plurality of contact holes may be increased.

Figure 5:
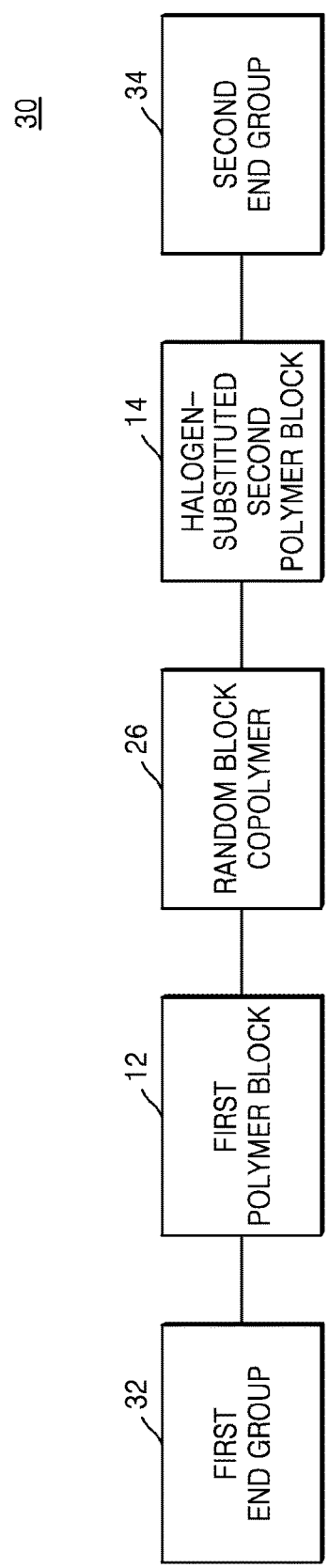
FIG. 5 is a schematic block diagram of a block copolymer according to example embodiments.

FIG. 5 is a schematic block diagram of a block copolymer 30 according to embodiments. In FIG. 5, like reference numbers as illustrated in FIGS. 1 to 4 are used to refer to like elements and redundant descriptions thereof will be omitted.

Referring to FIG. 5, the block copolymer 30 may include a first polymer block 12, a second polymer block 14, a first end group 32 connected to the first polymer block 12, a second end group 34 connected to the second polymer block 14, and a random block copolymer 26 which is connected between the first polymer block 12 and the second polymer block 14 and in which at least two repeating units are randomly copolymerized.

The first end group 32 may include at least one selected from a dithioester group and a trithiocarbonate end group.

The second end group 34 may include at least one selected from a hydrogen atom, a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid, a phosphate, a substituted or unsubstituted $C_1$-$C_{40}$ alkyl group, a substituted or unsubstituted $C_1$-$C_{40}$ alkoxy group, a substituted or unsubstituted $C_7$-$C_{40}$ aryl group, a substituted or unsubstituted $C_6$-$C_{40}$ aryloxy group, a substituted or unsubstituted $C_2$-$C_{40}$ alkenyl group, a substituted or unsubstituted $C_1$-$C_{40}$ alkylamino group, a substituted or unsubstituted $C_6$-$C_{40}$ arylamino group, a substituted or unsubstituted $C_3$-$C_{20}$ alkylsilyl group, a substituted or unsubstituted $C_8$-$C_{40}$ arylsilyl group, a substituted or unsubstituted $C_7$-$C_{40}$ ketoaryl group, a substituted or unsubstituted $C_7$-$C_{40}$ ketoheteroaryl group, a substituted or unsubstituted $C_1$-$C_{40}$ haloalkyl group, a $C_1$-$C_{40}$ fused aliphatic ring, a fused aromatic ring, a fused heteroaliphatic ring, and a fused heteroaromatic ring.

The first end group 32 and the second end group 34 may include at least one heteroatom selected from nitrogen (N), oxygen (O), phosphorous (P), sulfur (S), boron (B), silicon (Si), a halogen atom, and a metal atom. Examples of the metal atom capable of being included in the first end group 32 and the second end group 34 may include at least one selected from titanium (Ti), zirconium (Zr), ruthenium (Ru), tungsten (W), and molybdenum (Mo), but are not limited thereto. The heteroatom may be included in the range of about 0 weight % to about 5 weight % with respect to a total weight of the block copolymer 30.

In example embodiments, the block copolymer 30 illustrated in FIG. 5 may include a structure of the following Formula (3):

Formula (3)

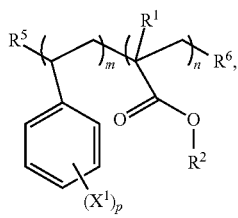

Formula (5)

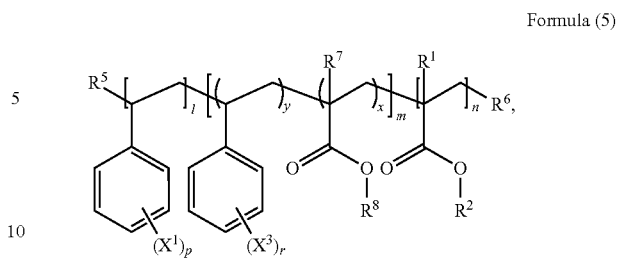

where $X^1$, p, $R^1$, and $R^2$ are substantially the same as defined above.

$R^5$ may be a sulfur-containing functional group expressed by —S—(C=S)—R. R' may include at least one selected from a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, and a substituted or unsubstituted $C_6$-$C_{10}$ aryl group.

$R^6$ may include at least one selected from a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group. In Formula (3), m/(m+n) may be 0.6 to 0.8.

The random block copolymer 26 of the block copolymer 30 illustrated in FIG. 5 may be expressed by the following Formula (4):

Formula (4)

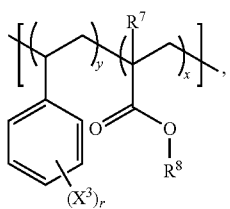

where $X^3$ is a halogen atom, r is an integer from 1 to 5, each of $R^7$ and $R^8$ is one of a hydrogen atom, a $C_1$-$C_5$ straight-chain or branched alkyl group, and a $C_1$-$C_5$ alkyl halide group, and x/(x+y)=0.2 to 0.8.

For example, each of $R^7$ and $R^8$ of Formula (4) may include at least one selected from a methyl group, an ethyl group, a propyl group, an isopropyl group, an n-butyl group, an isobutyl group, a tert-butyl group, a pentyl group, an isopentyl group, and a neopentyl group.

In example embodiments, the random block copolymer 26 may have a molecular weight of about 1 kg/mol to about 15 kg/mol within the block copolymer 30 illustrated in FIG. 5.

In example embodiments, the block copolymer 30 illustrated in FIG. 5 may include a structure of the following Formula (5):

where $X^1$, $X^3$, p, r, $R^1$, $R^2$, $R^5$, $R^6$, $R^7$, and $R^8$ are substantially the same as defined above. In Formula (5), l/(l+m+n) may be 0.6 to 0.8, m/(l+m+n) may be 0.01 to 0.15, and x/(x+y) may be 0.2 to 0.8.

A block copolymer expressed by Formula (5) may have a molecular weight of about 80 kg/mol to about 100 kg/mol and a polydispersity of about 1.2 or more.

Hereinafter, specific Synthesis Examples of block copolymers according to embodiments will be described.

Synthesis Example 1

Synthesis of PFS-b-PMMA Block Copolymer

Figure 6:
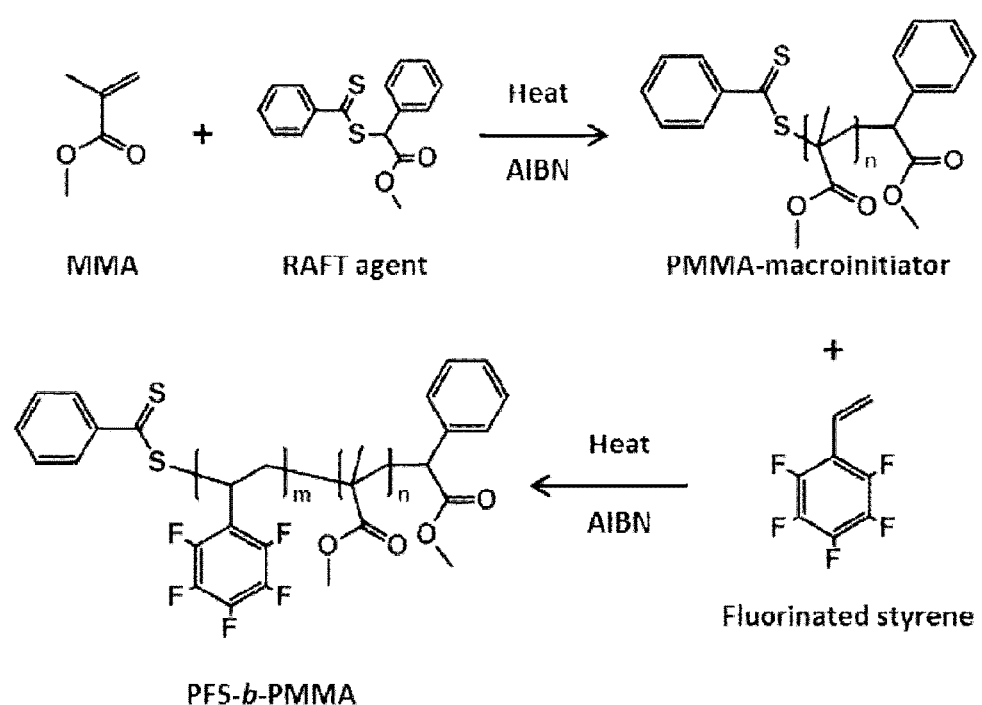
FIG. 6 is a schematic diagram for describing a process of synthesizing a PFS-b-PMMA block copolymer.

A process of synthesizing a PFS-b-PMMA block copolymer is illustrated in FIG. 6.

As illustrated in FIG. 6, reversible addition-fragmentation chain transfer (RAFT) polymerization was used for synthesizing the PFS-b-PMMA block copolymer.

In Synthesis Example 1, a target molecular weight of the PFS-b-PMMA block copolymer was set to about 80,000 g/mol, and a target molecular weight ratio of a PMMA block to a PFS block was set to about 3:7.

A RAFT agent including methyl 2-phenyl-2-[(phenylcarbonothioyl)thio]acetate, an MMA monomer, and an initiator, i.e., 2,2'-azobisisobutyronitrile (AIBN) were mixed into a dimethylformamide (DMF) solvent, and the RAFT agent, the MMA monomer, the AIBN, and the DMF solvent reacted with one another at a temperature of about 70° C. for about 48 hours. A target molecular weight of the PMMA block was about 23,000 g/mol, and MMA and the RAFT agent were used in an amount calculated based on a case where a conversion rate of a used raw material monomer into a block copolymer was about 85%. The initiator was used in an amount of about 5 mol % with respect to an amount of the RAFT agent. An intermediate product, i.e., PMMA-macroinitiator including a PMMA with a molecular weight of about 23,000 g/mole and a polydispersity (Ð) of about 1.21 was obtained as a result of the reaction at the temperature of about 70° C. for about 48 hours.

In order to synthesize the PFS block, fluorinated styrene (FS) and an initiator, i.e., AIBN were mixed into a DMG solvent, and the FS, the AIBN, and the DMF solvent reacted with one another at a temperature of about 70° C. for about 48 hours by using the intermediate product, i.e., PMMA-macroinitiator as a RAFT agent. A target molecular weight of PFS was determined based on the target molecular weight of the PMMA block. That is, in order for the target molecular weight ratio of the PMMA block to the PFS block to be set to about 3:7, the target molecular weight of the PFS was set to about 55,000 g/mol, and a conversion rate of a used raw material monomer into a block copolymer was set to about 30%. About 58,400 g/mol of the PFS block was synthesized as a result of a reaction at a temperature of about 70° C. for about 72 hours. Accordingly, finally prepared PMMA-b-PFS had a total molecular weight of about 82,100 g/mol and a polydispersity (Đ) of about 1.20.

Synthesis Example 2

Synthesis of PFS-b-P(FS-r-MMA)-b-PMMA Block Copolymer (I)

Figure 7:
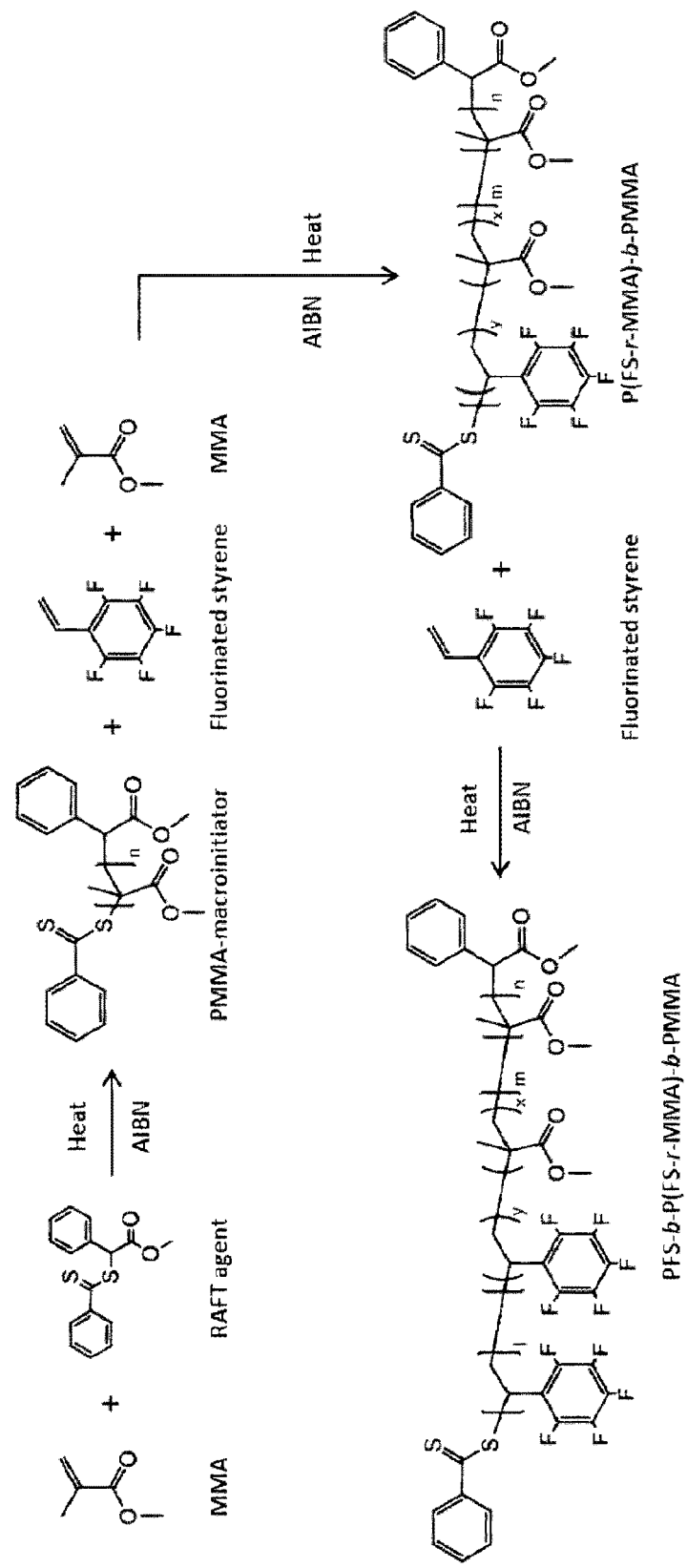
FIG. 7 is a schematic diagram for describing a process of synthesizing a PFS-b-P(FS-r-MMA)-b-PMMA block copolymer.

A process of synthesizing a PFS-b-P(FS-r-MMA)-b-PMMA block copolymer is illustrated in FIG. 7.

RAFT polymerization was used for synthesizing the PFS-b-P(FS-r-MMA)-b-PMMA block copolymer as illustrated in FIG. 7.

In Synthesis Example 2, a target molecular weight of the PFS-b-P(FS-r-MMA)-b-PMMA block copolymer was set to about 80,000 g/mol, and a target molecular weight ratio of a PMMA block to a PFS block was set to about 3:7.

A RAFT agent including methyl 2-phenyl-2-[(phenylcarbonothioyl)thio]acetate, an MMA monomer, and an initiator, i.e., AIBN were mixed into a DMF solvent, and the RAFT agent, the MMA monomer, the AIBN, and the DMF solvent reacted with one another at a temperature of about 70° C. for about 48 hours. A target molecular weight of the PMMA block was about 23,000 g/mol, and MMA and the RAFT agent were used in an amount calculated based on a case where a conversion rate of a used raw material monomer into a block copolymer was about 85%. The initiator was used in an amount of about 5 mol % with respect to an amount of the RAFT agent. An intermediate product, i.e., PMMA-macroinitiator including a PMMA with a molecular weight of about 23,000 g/mole and a polydispersity (Đ) of about 1.21 was obtained as the result of the reaction at the temperature of about 70° C. for about 48 hours.

In order to synthesize a P(FS-r-MMA) block, FS, MMA, and an initiator, i.e., AIBN were mixed into a DMF solvent, and the FS, the MMA, the AIBN, and the DMF solvent reacted with one another at a temperature of about 70° C. for about 48 hours by using the intermediate product, i.e., PMMA-macroinitiator as a RAFT agent. A target molecular weight of the P(FS-r-MMA) block was set to about 4,000 g/mol, and a conversion rate of a used raw material monomer into a block copolymer was set to about 30%. A molar ratio of the FS to the MMA was set to about 5:5. About 3,400 g/mol of the P(FS-r-MMA) block was synthesized as the result of the reaction at the temperature of about 70° C. for about 48 hours. Accordingly, a prepared intermediate product, i.e., P(FS-r-MMA)-b-PMMA PMMA-b-PFS had a total molecular weight of about 27,000 g/mol and a polydispersity (Đ) of about 1.22.

In order to synthesize the PFS block, FS and an initiator, i.e., AIBN were mixed into a DMF solvent, and the FS, the AIBN, and the DMF solvent reacted with one another at a temperature of about 70° C. for about 48 hours by using the intermediate product, i.e., P(FS-r-MMA)-b-PMMA as a RAFT agent. A target molecular weight of PFS was determined based on the target molecular weight of the PMMA block. That is, in order for the target molecular weight ratio of the PMMA block to the PFS block to be set to about 3:7, the target molecular weight of the PFS was set to about 55,000 g/mol, and a conversion rate of a used raw material monomer into a block copolymer was set to about 30%. About 55,100 g/mol of the PFS block was synthesized as a result of a reaction at a temperature of about 70° C. for about 72 hours. Accordingly, finally prepared PMMA-b-P(FS-r-MMA)-b-PFS had a total molecular weight of about 82,100 g/mol and a polydispersity (Đ) of about 1.23.

Synthesis Example 3

Synthesis of PFS-b-P(FS-r-MMA)-b-PMMA Block Copolymer (II)

About 8,400 g/mol of a P(FS-r-MMA block was synthesized in the same manner as Synthesis Example 2 except that a target molecular weight of the P(FS-r-MMA block was set to about 8,000 g/mol. Accordingly, a prepared intermediate product, i.e., P(FS-r-MMA)-b-PMMA had a total molecular weight of about 32,000 g/mol and a polydispersity (Đ) of about 1.24.

About 55,300 g/mole of a PFS block was synthesized in the same manner as Synthesis Example 2 using the prepared intermediate product, i.e., P(FS-r-MMA)-b-PMMA as a RAFT agent. Accordingly, finally prepared PMMA-b-P(FS-r-MMA)-b-PFS had a total molecular weight of about 87,300 g/mol and a polydispersity (Đ) of about 1.23.

Figure 8A:
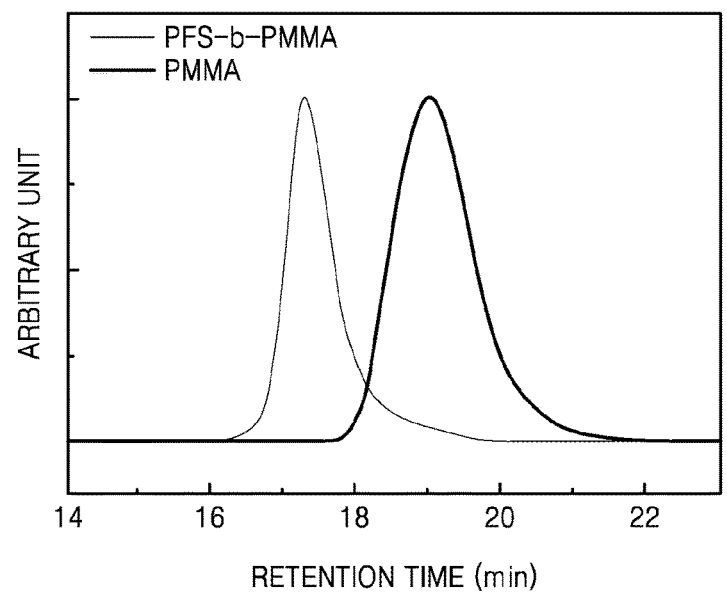
FIG. 8A is a graph showing a gel permeation chromatography (GPC) trace of a polymer block according to a process of synthesizing a PFS-b-PMMA block copolymer obtained in Synthesis Example 1.

FIG. 8A is a graph showing a gel permeation chromatography (GPC) trace of a polymer block according to a process of synthesizing the PFS-b-PMMA block copolymer (Example 1) obtained in Synthesis Example 1.

Figure 8B:
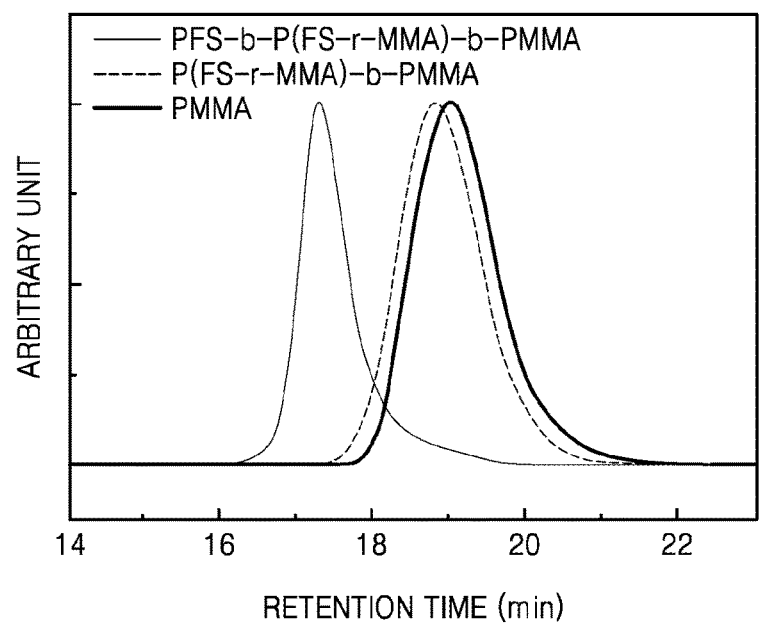
FIG. 8B is a graph showing a GPC trace of a polymer block according to a process of synthesizing a PFS-b-P(FS-r-MMA)-b-PMMA block copolymer obtained in Synthesis Example 2.

FIG. 8B is a graph showing a GPC trace of a polymer block according to a process of synthesizing the PFS-b-P (FS-r-MMA)-b-PMMA block copolymer (Example 2) obtained in Synthesis Example 2.

FIG. 8B is a graph showing a GPC trace of a polymer block according to a process of synthesizing the PFS-b-P (FS-r-MMA)-b-PMMA block copolymer (Example 3) obtained in Synthesis Example 3.

Figure 8C:
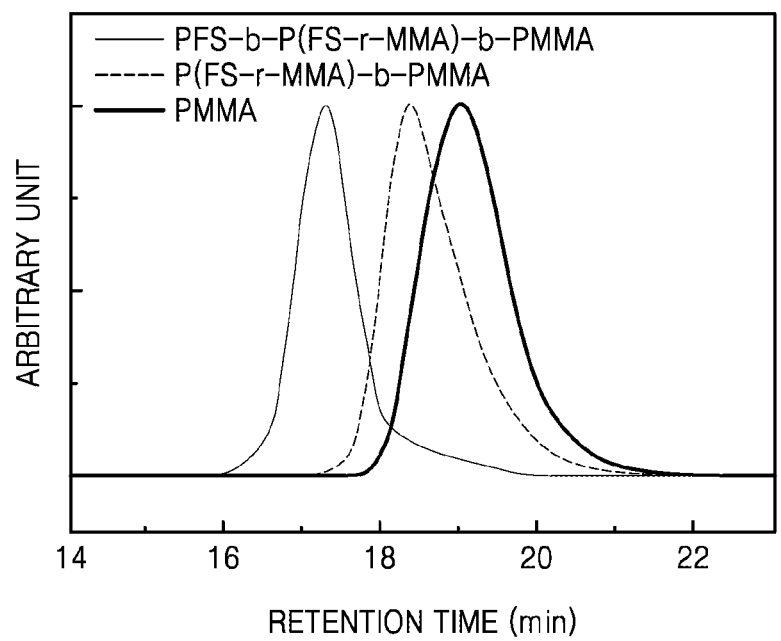
FIG. 8C is a graph showing a GPC trace of a polymer block according to a process of synthesizing a PFS-b-P(FS-r-MMA)-b-PMMA block copolymer obtained in Synthesis Example 3.

In FIGS. 8A to 8C, as the process of synthesizing the block copolymer proceeds, a retention time may be decreased, and a peak may be constant. From the result, the synthesis of the block copolymer is performed at a constant dispersity.

The methyl 2-phenyl-2-[(phenylcarbonothioyl)thio]acetate is used as the RAFT agent in Synthesis Examples 1 to 3, but example embodiments are not limited thereto.

Various RAFT agents may be used to synthesize the block copolymer according to example embodiments using RAFT polymerization. Examples of the RAFT agent may include at least one selected from a dithiobenzoate-based compound and a trithiocarbonate-based compound. In order to synthesize the block copolymer according to example embodiments, examples of the trithiocarbonate-based compound suitable to be used as the RAFT agent may include 2-cyano-2-propyl benzodithioate, etc., in addition to the methyl 2-phenyl-2-[(phenylcarbonothioyl)thio]acetate used in Synthesis Examples 1 to 3.

Figure 9A:
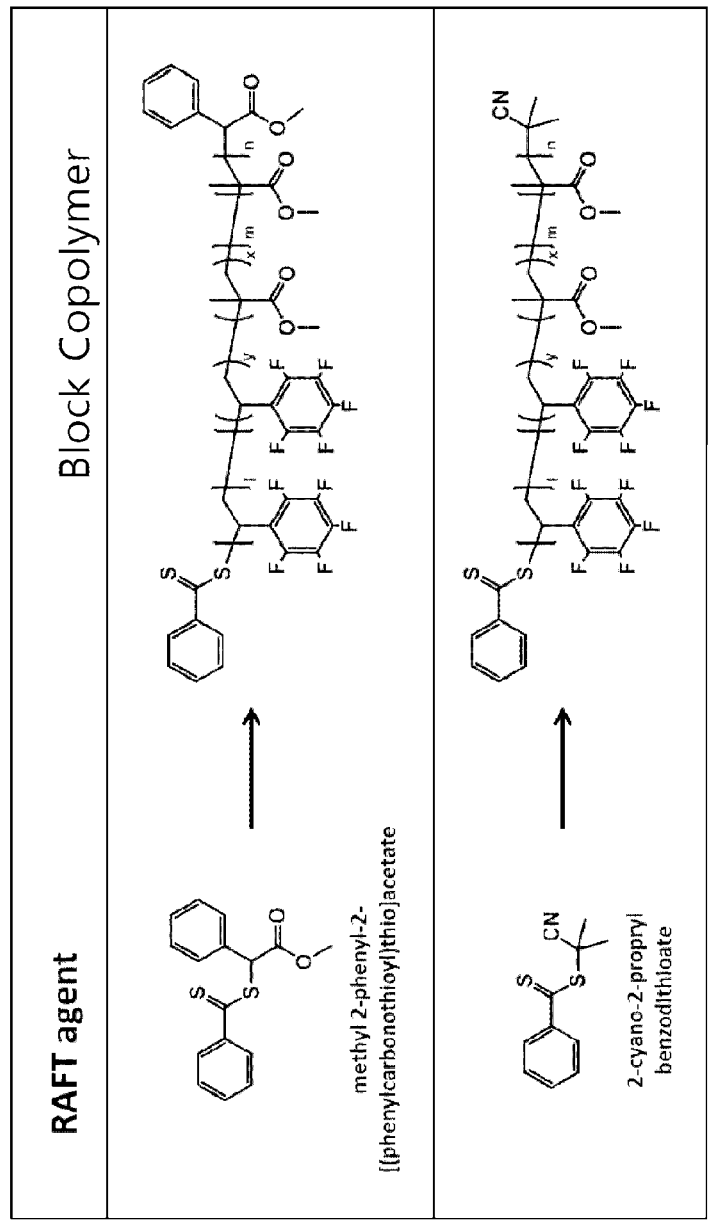
FIG. 9A is a table showing a reversible addition-fragmentation chain transfer (RAFT) agent including a dithiobenzoate-based compound and block copolymers obtainable from the RAFT agent, according to example embodiments.

FIG. 9A is a table showing a RAFT agent including a dithiobenzoate-based compound and block copolymers obtainable from the RAFT agent, according to embodiments.

Figure 9B:
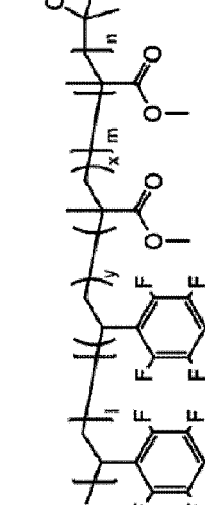
FIG. 9B is a table showing a RAFT agent including a trithiocarbonate-based compound and block copolymers obtainable from the RAFT agent, according to example embodiments.

FIG. 9B is a table showing a trithiocarbonate-based compound suitable to be used as a RAFT agent in synthesizing a block copolymer according to embodiments and block copolymers obtainable from the trithiocarbonate-based compound, according to embodiments.

However, the RAFT agent used in synthesizing the block copolymer according to example embodiments is not limited to the compounds illustrated in FIGS. 9A and 9B. Various RAFT agents may be used according to the need. In addition, block copolymers having various structures may be obtained by using the various RAFT agents without departing the scope of the inventive concepts.

FIGS. 10A, 11A, 12A, 13A, and 14A are plan views of a method of forming fine patterns, and FIGS. 10B, 11B, 12B, 13B, and 14B are respectively cross-sectional views taken along lines B-B' of FIGS. 10A, 11A, 12A, 13A, and 14A.

Figure 10A:
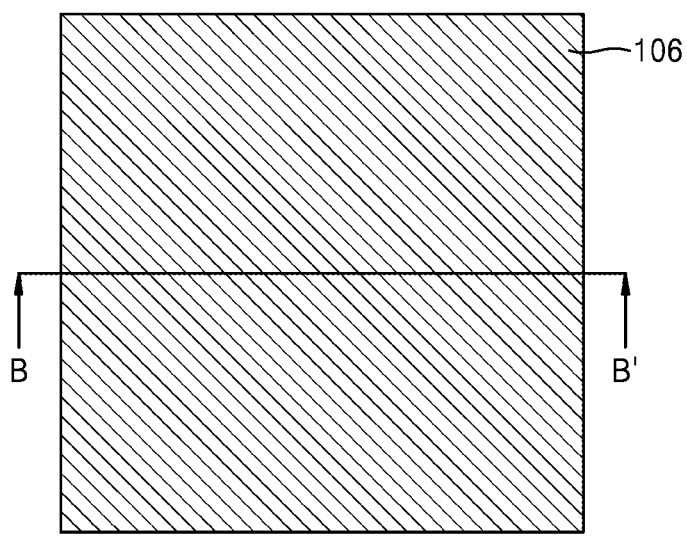
FIGS. 10A, 11A, 12A, 13A, and 14A are plan views for describing a method of forming fine patterns.
Figure 10B:
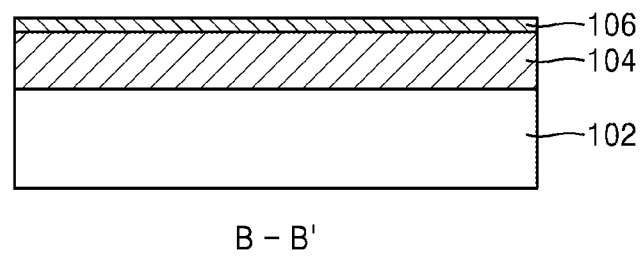
FIGS. 10B, 11B, 12B, 13B, and 14B are respectively cross-sectional views taken along lines B-B' of FIGS. 10A, 11A, 12A, 13A, and 14A.

Referring to FIGS. 10A and 10B, a feature layer 104 may be formed on a substrate 102, and a brush liner 106 may be formed on the feature layer 104.

The substrate 102 may include a semiconductor substrate. In example embodiments, the substrate 102 may include a semiconductor element (e.g., Si or Ge). In example embodiments, the substrate 102 may include a compound semiconductor material (e.g., SiGe, SiC, GaAs, InAs, or InP). In example embodiments, the substrate 102 may have a silicon on insulator (SOI) structure. The substrate 102 may include a conductive region, for example, an impurity-doped well or an impurity-doped structure. In addition, the substrate 102 may have various device isolation structures (e.g., a shallow trench isolation (STI) structure).

The feature layer 104 may be an insulating film or a conductive film. For example, the feature layer 104 may include one selected from a metal, an alloy, metal carbide, metal nitride, metal oxynitride, metal oxycarbide, a semiconductor, polysilicon, oxide, nitride, oxynitride, a hydrocarbon compound, and combinations thereof, but is not limited thereto. When fine patterns to be finally formed are implemented on the substrate 102, the feature layer 104 may be omitted.

In example embodiments, the brush liner 106 may include a neutral organic material having an approximately similar affinity with respect to each of a plurality of polymer blocks constituting a block copolymer layer 130 to be described with reference to FIGS. 11A and 11B. For example, the brush liner 106 may include a random block copolymer that includes polymers and an anchoring polymer, the polymers having a repeating unit of each of the plurality of polymer blocks constituting the block copolymer layer 130, and the anchoring polymer having a repeating unit including a primary hydroxyl group. The anchoring polymer may be obtained from a monomer unit (e.g., 2-hydroxyethyl methacrylate, 3-hydroxypropyl methacrylate, or 4-hydroxybutyl methacrylate). In the random block copolymer, the anchoring polymer may be included in the range of about 0.01 weight % to about 10 weight % with respect to a total weight of the random block copolymer.

In example embodiments, in order to form the brush liner 106, a process of attaching the random block copolymer on an exposed surface of the feature layer 104 may be performed by using the primary hydroxyl group of the anchoring polymer as an anchoring group.

In example embodiments, in order to form the brush liner 106, after the feature layer 104 is coated with a polymer composite including the random block copolymer, a heat treatment may be performed on the polymer composite. The heat treatment may be performed at a temperature of about 150° C. to about 300° C. for about 60 seconds to about 300 seconds, but is not limited thereto. An unreacted portion of the polymer composite including the random block copolymer may be removed by using an organic solvent. Examples of the organic solvent may include at least one selected from propylene glycol monomethyl ester acetate (PGMEA), propylene glycol monomethyl ester (PGME), ethyl-3-ethoxy propionate (EEP), ethyl lactate (EL), methyl 2-hydroxybutylate (HBM), and gamma-butyro lactone (GBL), but are not limited thereto.

In example embodiments, the brush liner 106 may be formed to have a thickness of about 2 nm to about 15 nm.

Figure 11A:
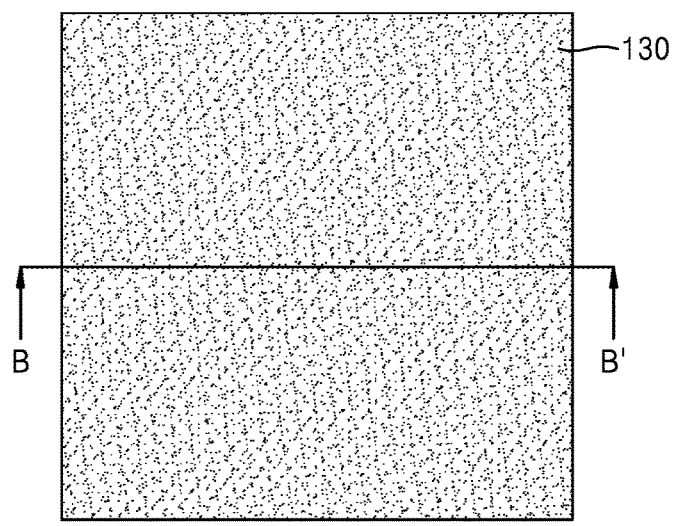
Figure 11B:
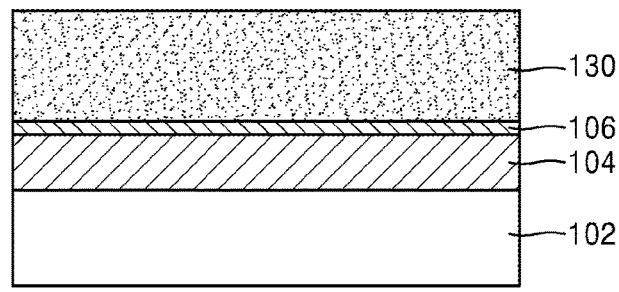

Referring to FIGS. 11A and 11B, the block copolymer layer 130 may be formed on the brush liner 106.

The block copolymer layer 130 may include a block copolymer that includes a first polymer block having a first solubility parameter and a second polymer block having a second solubility parameter less than the first solubility parameter and having a halogen-substituted structure.

In example embodiments, the block copolymer layer 130 may include a block copolymer structure of one of the block copolymers 10, 20, and 30 described with reference to FIGS. 1, 3, and 5.

In example embodiments, the block copolymer layer 130 may include one selected from the block copolymers having the structures of Formulas (1), (3), and (5); and block copolymers having various modifications from the structures without departing the scope of the inventive concepts.

In example embodiments, the block copolymer constituting the block copolymer layer 130 may include the first polymer block and the second polymer block, which have different solubility parameters. The first polymer block and the second polymer block may respectively include different polymer blocks selected from poly(methyl methacrylate) (PMMA), poly(ethylene oxide) (PEO), poly(lactic acid) (PLA), polyisoprene (PI), and poly(fluorinated styrene) (PFS). For example, the first polymer block may include one selected from PMMA, PEO, PLA, and PI, and the second polymer block may include PFS.

The block copolymer constituting the block copolymer layer 130 may include the random block copolymer expressed by Formula (2) or (4). The random block copolymer may have a molecular weight of about 1 kg/mol to about 15 kg/mol. The block copolymer constituting the block copolymer layer 130 may have a molecular weight of about 80 kg/mol to about 100 kg/mol and a polydispersity of about 1.2 or more.

In order to form the block copolymer layer 130, after one of the block copolymers according to example embodiments is dissolved in an organic solvent, the brush liner 106 may be coated with the obtained solution by a dip coating process, a solution casting process, or a spin coating process. Examples of the organic solvent may include at least one selected from propylene glycol monomethyl ester acetate (PGMEA), propylene glycol monomethyl ester (PGME), ethyl-3-ethoxy propionate (EEP), ethyl lactate (EL), methyl 2-hydroxybutylate (HBM), and gamma-butyro lactone (GBL), toluene, and tetrahydrofuran (THF), but are not limited thereto.

Figure 12A:
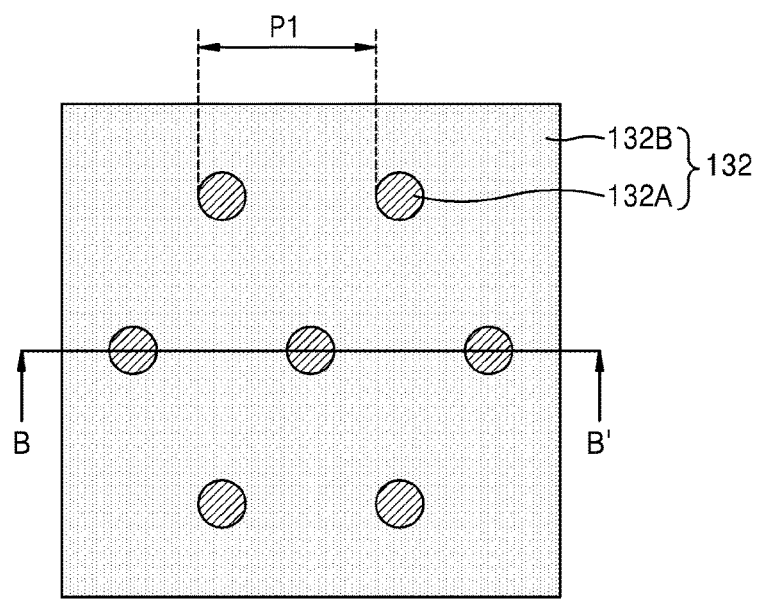
Figure 12B:
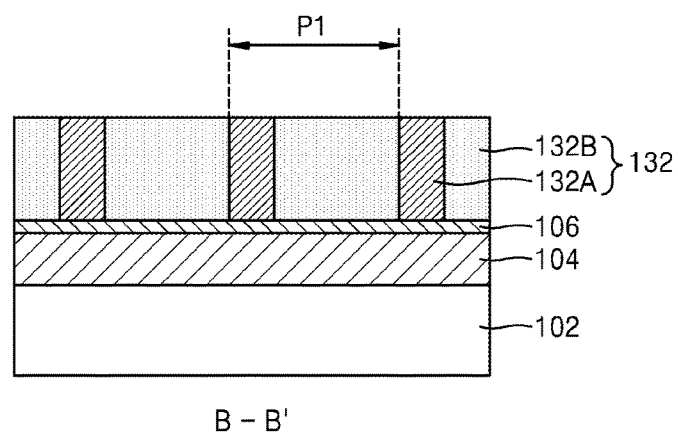

Referring to FIGS. 12A and 12B, a self-assembly layer 132 including a plurality of first domains 132A and a second domain 132B may be formed by phase-separating the block copolymer layer 130 (see FIGS. 11A and 11B), the plurality of first domains 132A including the first polymer block, and the second domain 132B including the second polymer block. The second domain 132B may be formed so as to surround the plurality of first domains 132A.

In order to phase-separate the block copolymer layer 130, the block copolymer layer 130 may be annealed at a temperature that is greater than a glass transition temperature Tg of the block copolymer in the block copolymer layer 130. For example, in order to phase-separate the block copolymer layer 130, the block copolymer layer 130 may be annealed at a temperature of about 130° C. to about 190° C. for about 1 hour to about 24 hours.

The plurality of first domains 132A may be regularly arranged. For example, the plurality of first domains 132A may be arranged so as to form a hexagonal array having a pitch P1.

The block copolymer layer 130 (see FIGS. 11A and 11B) may be phase-separated on the brush liner 106 including a neutral liner that has an approximately same affinity with respect to each of the first polymer block included in the first domains 132A and the second polymer block included in the second domain 132B, so that improving vertical alignment characteristics of the first domains 132A on the brush liner 106 may be possible.

In example embodiments, the first polymer block included in the plurality of first domains 132A may include one selected from PMMA, PEO, PLA, and PI, and the second polymer block included in the second domain 132B may include PFS.

Figure 13A:
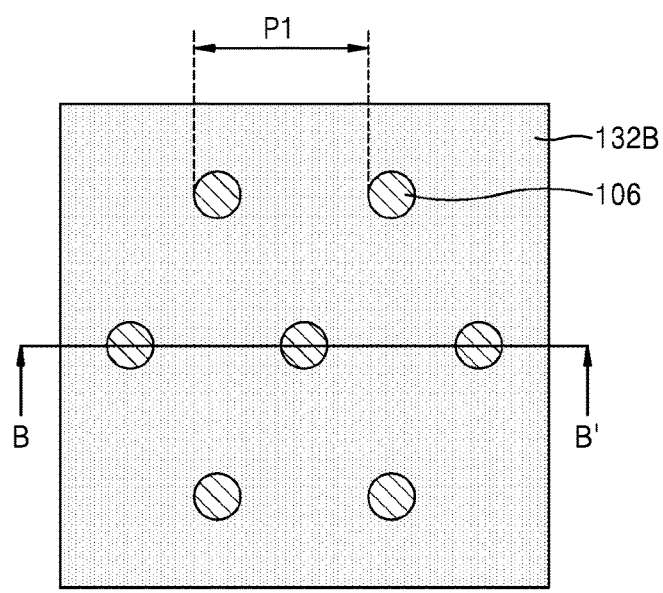
Figure 13B:
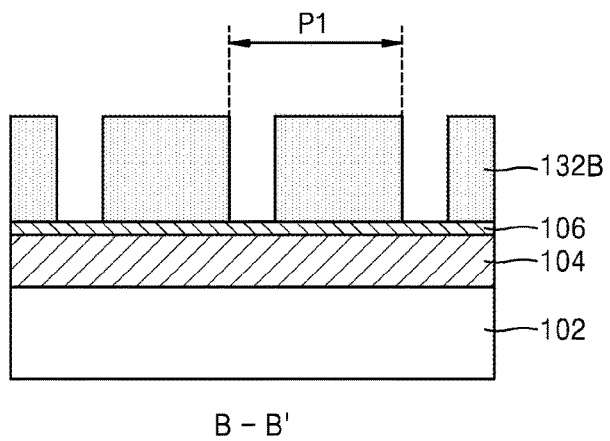

Referring to FIGS. 13A and 13B, the plurality of first domains 132A may be removed from the self-assembly layer 132 (see FIGS. 12A and 12B).

In example embodiments, in order to selectively remove only the plurality of the first domains 132A from the self-assembly layer 132, after the plurality of first domains 132A are selectively decomposed by applying a polymer decomposer to the self-assembly layer 132, a process of stripping the plurality of decomposed first domains 132A may be performed by using a cleaning fluid, for example, isopropyl alcohol (IPA). In example embodiments, the polymer decomposer may be a radiant ray or plasma. The radiant ray may be applied in an oxygen atmosphere and may be deep ultraviolet (DUV), a soft X-ray, or an E-beam. The plasma may be oxygen plasma. In order to selectively decompose the plurality of first domains 132A, a kind or energy of the polymer decomposer may be selected. For example, threshold energy capable of starting to decompose the plurality of first domains 132A may be different from threshold energy capable of starting to decompose the second domain 132B. Therefore, a radiant ray or plasma, which has energy capable of selectively decomposing only the plurality of first domains 132A of the plurality of first domains 132A and the second domain 132B, may be applied to the self-assembly layer 132. Energy of the radiant ray or energy of the plasma may be adjusted by a radiation time of the radiant ray or an exposure time of the plasma.

In example embodiments, while the plurality of first domains 132A are removed, a portion of the brush liner 106, which is to be exposed after the plurality if first domains 132a are removed, may be removed.

Figure 14A:
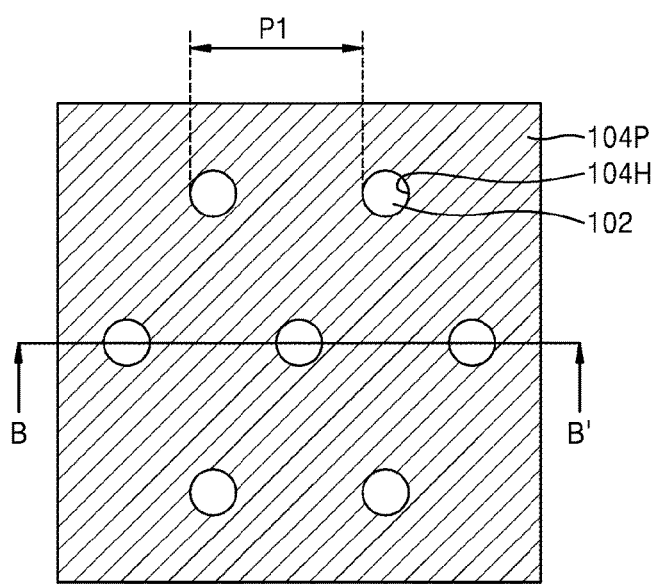
Figure 14B:
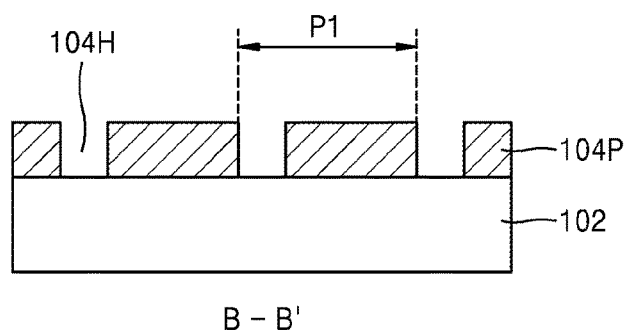

Referring to FIGS. 14A and 14B, fine patterns 104P, in which a plurality of hole 104H are formed, may be formed by etching the brush liner 106 and the feature layer 104 by using the second domain 132B (see FIGS. 13A and 13B) as an etching mask.

An upper surface of the fine patterns 104P may be exposed by removing the second domain 132B and the brush liner 106, which remain on the fine patterns 104P.

A plurality of holes 104H formed in the fine patterns 104P may be arranged so as to form a hexagonal array having the pitch P1.

According to the method of forming the fine patterns described with reference to FIGS. 10A to 14B, even when the block copolymer according to example embodiments constituting the block copolymer layer 130 has a relatively small molecular weight, the block copolymer may have a large polydispersity (DPI) compared to a common block copolymer having the same molecular weight as the block copolymer according to example embodiments. Accordingly, the pitch P1 of the fine patterns 104P or the plurality of first domains 132A obtained by phase-separating the block copolymer layer 130 may be increased compared to a case where the common block copolymer is used. In addition, since the solubility parameter difference is relatively large between the first polymer block and the second polymer block constituting the block copolymer layer 130, the block copolymer layer 130 may have a relatively large Flory-Huggins interaction parameter $\chi$. When the fine patterns 104P including the plurality of holes 104H are formed, a pitch of the plurality of holes 104H may be increased due to the relatively large Flory-Huggins interaction parameter $\chi$. Accordingly, improving the LER and the CD uniformity of the fine patterns 104P may be possible.

Figure 15A:
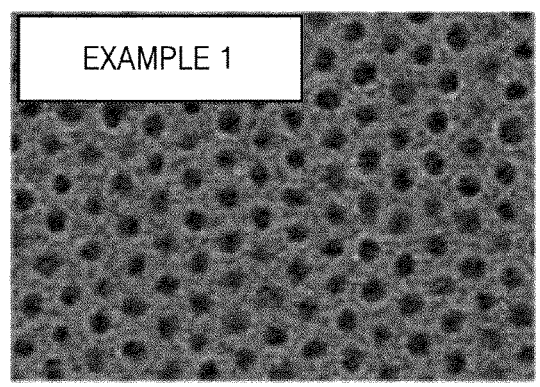
FIG. 15A to 15C are scanning electron microscope (SEM) images respectively showing the evaluation results of phase separation characteristics of block copolymers according to example embodiments.
Figure 15B:
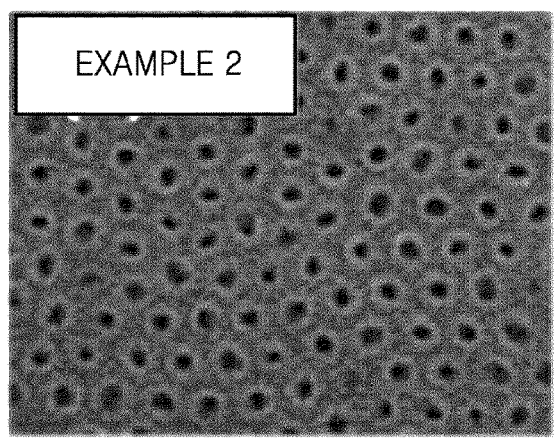
Figure 15C:
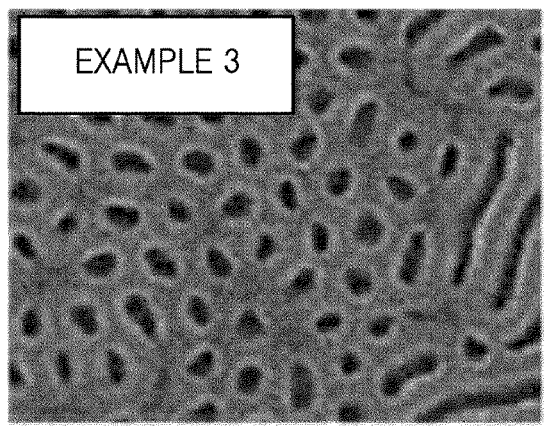

FIG. 15A to 15C are scanning electron microscope (SEM) images respectively showing the evaluation results of phase separation characteristics of block copolymers according to embodiments.

In order to obtain the evaluation results of FIGS. 15A to 15C, after a neutral brush liner was formed on a Si wafer, samples forming block copolymer layers were prepared on the neutral brush liner, the block copolymer layers respectively including the PFS-b-PMMA block copolymer (Example 1) obtained in Synthesis Example 1, the PFS-b-P(FS-r-MMA)-b-PMMA block copolymer (Example 2) obtained in Synthesis Example 2, and the PFS-b-P(FS-r-MMA)-b-PMMA block copolymer (Example 3) obtained in Synthesis Example 3. After each of the block copolymer layers was phase-separated by annealing each of the prepared samples to thereby form a self-assembly layer including a plurality of PMMA domains and a PFS domain surrounding the plurality of PMMA domains, the plurality of PMMA domains were removed from the self-assembly layer by using DUV and was stripped by using IPA. After that, each of the SEM images was analyzed.

Figure 15D:
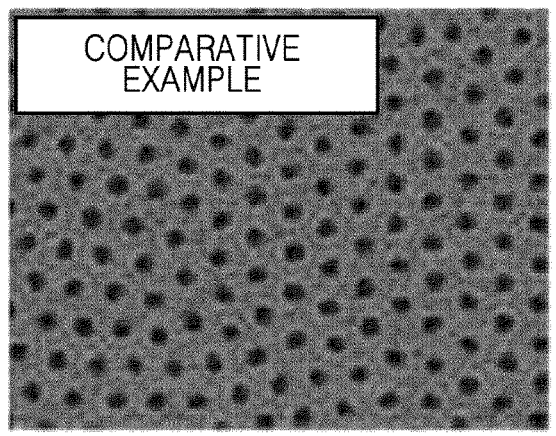
FIG. 15D is a SEM image showing the evaluation result of phase separation characteristics of a PS-b-PMMA block copolymer according to Comparative Example.

FIG. 15D is a SEM image showing the evaluation result of phase separation characteristics of a PS-b-PMMA block copolymer (Comparative Example) with a molecular weight of about 80 kg/mol and a polydispersity (PDI) of about 1.07 in the same manner as Examples 1 to 3.

As can be seen from the evaluation results of FIGS. 15A to 15D, in spite of the block copolymers that were similar to one another in terms of the molecular weight range, in the self-assembly layers obtained by phase-separating the block copolymers having an increased effective dispersity (Đ eff) according to Examples 1 to 3, a pitch of a plurality of holes formed by removing the plurality of PMMA domains was increased compared to Comparative Example.

Form the evaluation results of FIGS. 15A to 15D, when an effective dispersity (Đ eff) of the block copolymer is increased, elastic energy of the block copolymer may be decreased, so that a size of domains may be increased. Accordingly, the pitch of the plurality of holes formed in the self-assembly layer may be increased.

Figure 16A:
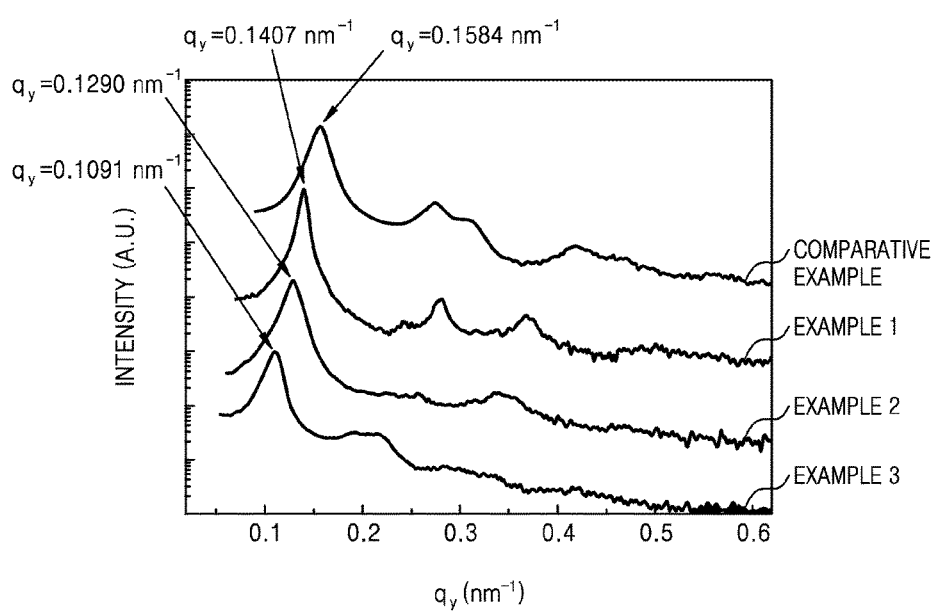
FIG. 16A is a graph showing the analysis results of pattern shapes of a plurality of holes respectively formed in self-assembly layers obtained from block copolymers according to Examples 1 to 3 and a block copolymer according to Comparative Example.

FIG. 16A is a graph showing the analysis results of pattern shapes in a plurality of holes respectively formed in self-assembly layers, by using samples of Examples 1 to 3 and a sample of Comparative Example, which are used for the analysis of FIGS. 15A to 15D.

Figure 16B:
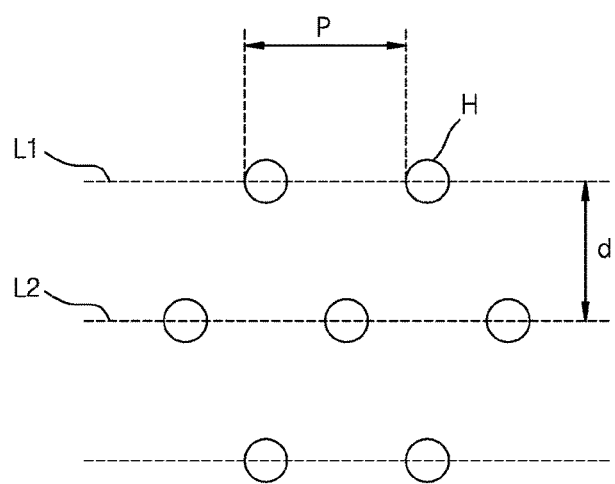
FIG. 16B is a diagram for describing a process of calculating pitches of a plurality of holes formed in self-assembly layers obtained from block copolymers according to Examples 1 to 3 and a block copolymer according to Comparative Example.

FIG. 16B is a diagram for describing a process of calculating pitches of the plurality of the holes H respectively formed in the samples of Examples 1 to 3 and the sample of Comparative Example.

In order for the analysis of FIG. 16A, grazing incident small angle X-ray scattering (GI-SAXS) was used to compare hole pattern arrangements according to Examples 1 to 3 with a hole pattern arrangement of Comparative Example.

In FIG. 6A, in a case of Example 1, a first peak was confirmed when $q_y = 0.1407$ nm$^{-1}$. $q_y$ is a scattering wave vector.

In an arrangement of the plurality of holes H illustrated in FIG. 16B, because a vertical distance is about $2\pi/q_y$ between a first line L1 and a second line L2 adjacent to and parallel with the first lines L1, a pitch P may be expressed by 2 $\pi/(q_y \times \sin 60°)$, the first line L1 passing through a plurality of holes H of the plurality of holes H, which are lined up in a row, and the second line L2 passing through a plurality of other holes H lined up in a row. Therefore, the pitch P of the plurality of holes in Example 1 is about 51.5 nm.

First peaks of Examples 2 and 3 were respectively confirmed when $q_y=0.1290$ nm$^{-1}$ and 0.1091 nm$^{-1}$. The pitches P of the plurality of holes H in Examples 2 and 3 are respectively about 56.1 nm and about 66.5 nm.

On the contrary, in a case of Comparative Example, a first peak was confirmed when $q_y=0.1584$ nm$^{-1}$, a pitch of the plurality of holes is about 45.7 nm.

From the analysis results of 16A, the pitches P of the plurality of holes H were respectively increased to about 56.1 nm and about 66.5 nm by respectively introducing about 3,400 kg/mol and about 8,400 kg/mole of the P(FS-r-MMA) block copolymer to the block copolymers of Examples 2 and 3. From the analysis results, the pitches of the plurality of holes in Examples 1 and 3 were respectively increased by about 22.7% and about 45.4% compared to Comparative Example.

In particular, in the case of Example 2, fine patterns including a plurality of holes were implemented from a block copolymer having a molecular weight of about 82.1 kg/mol, the plurality of holes being arranged at a pitch of about 56.1 nm. In order to form a plurality of hole patterns including a similar pitch of about 56 nm, in a case of a common PS-b-PMMA block copolymer, using a block copolymer having a molecular weight that is about twice the molecular weight of Example 2 may be desirable. However, when fine patterns are formed by using the block copolymer according to example embodiments, a plurality of hole patterns arranged at a relatively large pitch may be formed by using a block copolymer having a relatively small molecular weight.

As semiconductor devices are highly integrated, for example, in a case where a DSA process is applied so as to form a plurality of storage node holes in a process of forming a capacitor of a semiconductor memory device, there may be a need for a block copolymer having a pitch of about 50 nm or more. However, in a case where existing block copolymers known up to now are used, because a molecular weight of an existing block copolymer having a pitch of about 50 nm or more is excessively large, defects of a vertical alignment occur at the time of phase separation, and holes derived from a PMMA domain after phase separation are not formed. This is because when a molecular weight becomes excessively larger, due to the excessively large molecular weight, phase separation is not efficiently performed under a phase separation condition, for example, a heat treatment condition for the phase separation performed at a temperature of about 250° C. for about 300 seconds.

That is, when the existing block copolymer having the pitch of about 50 nm or more is used, defects of the vertical alignment at the time of the phase separation may be caused due to the excessively large molecular weight of the existing block copolymer having the pitch of about 50 nm and low mobility of block copolymer chains according to the excessively large molecular weight. Theses causes may count against the formation of a plurality of fine holes In order to overcome the limitations, when a phase separation temperature is increased, the mobility of the block copolymer chains may be improved, but degradation of the block copolymer may occur under a high temperature condition of about 250° C. or more.

Even when the block copolymers according to example embodiments have a relatively small molecular weight, implementing a plurality of holes having a relatively large pitch of about 50 nm or more may be possible. As a molecular weight of a block copolymer becomes smaller, mobility of block copolymer chains may be improved. Accordingly, the phase separation of the block copolymer may be effective.

In addition, up to now, as a molecular weight of a block copolymer has become smaller, a pitch of a plurality of holes to be implemented has been decreased. However, in the block copolymers according to example embodiments, because a solubility parameter difference is large between polymer blocks constituting the block copolymer, and the block copolymer has a larger Flory-Huggins interaction parameter $\chi$ due to the large solubility parameter difference, implementing a plurality of hole patterns having a relatively large pitch of about 50 nm or more from a block copolymer having a relatively small molecular weight and improving a CD uniformity of a plurality of holes may be possible.

In addition, in the analysis results of FIG. 16A, in the case of each of Examples 1 to 3, a ratio of a first peak to a second peak to a third peak is about $1:\sqrt{3}:\sqrt{14}$. From the analysis results, the plurality of holes obtained from each of the block copolymers of Examples 1 to 3 are arranged so as to form a hexagonal array.

Figure 17:
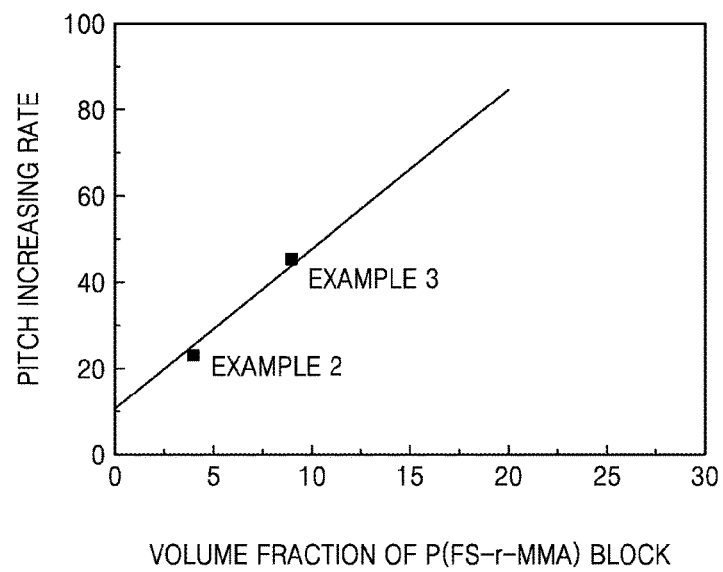
FIG. 17 is a graph showing a pitch increasing rate according to a volume fraction of a P(FS-r-MMA) block in each of block copolymers according to example embodiments.

FIG. 17 is a graph showing a pitch increasing rate according to a volume fraction of the P(FS-r-MMA) block in each of the block copolymers according to Examples 2 and 3, from the analysis results of Examples 2 and 3 obtained FIG. 16A.

From FIG. 17, as the volume fraction of the P(FS-r-MMA) block is increased in each of the block copolymers according to Examples 2 and 3, the pitch increasing rate is increased.

Figure 18:
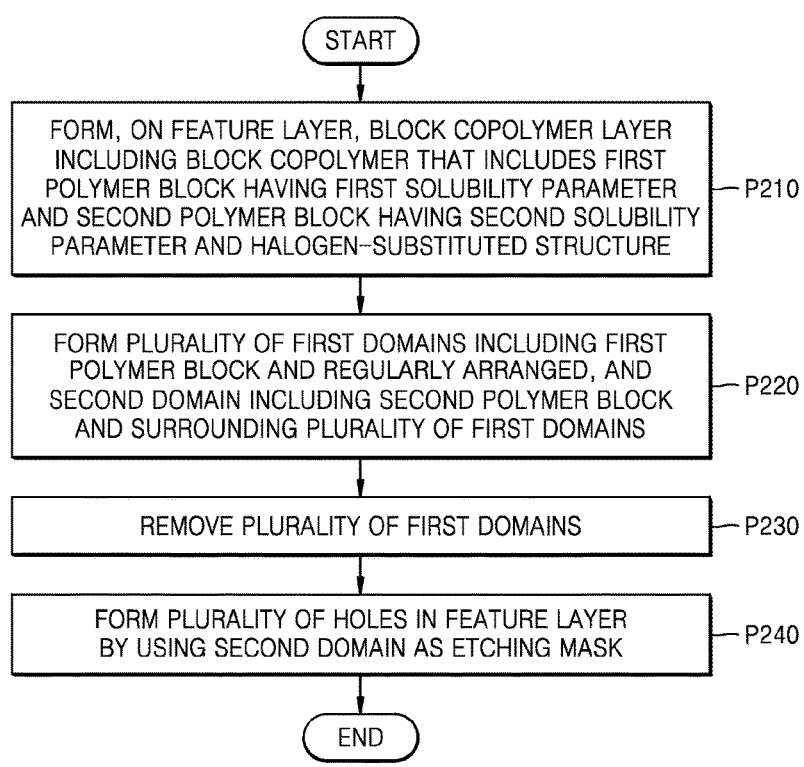
FIG. 18 is a flowchart of a method of manufacturing an integrated circuit device, according to example embodiments.

FIG. 18 is a flowchart of a method of manufacturing an integrated circuit device, according to embodiments.

Referring to FIG. 18, in process P210, a block copolymer layer 130 may be formed on a feature layer 104 formed on a substrate 102 in the same manner as described with reference to FIGS. 10A to 11B.

In process P220 of FIG. 18, a self-assembly layer 132 including a plurality of first domains 132A and a second domain 132B may be formed by phase-separating the block copolymer layer 130 in the same manner as described with reference to FIGS. 12A and 12B, the plurality of first domains 132A including a first polymer block and being regularly arranged, and the second domain 132B including a second polymer block and surrounding each of the plurality of first domains 132A.

The plurality of first domains 132A may be formed so as to be arranged in a hexagonal array. The plurality of first domains 132A may be formed so as to be regularly arranged at a pitch of about 50 nm or more.

In process P230 of FIG. 18, the plurality of first domains 132A may be removed in the same manner as described with reference to FIGS. 13A and 13B.

In process P240 of FIG. 18, fine patterns 104P, in which a plurality of holes 104H are formed, may be formed by etching the feature layer 104 by using the second domain 132B as an etching mask in the same manner as described with reference to FIGS. 14A and 14B.

According to the method of manufacturing the integrated circuit device according to example embodiments, a plurality of hole patterns arranged at a relatively large pitch may be obtained by using a block copolymer having a relatively small molecular weight.

The fine patterns 104P may be used to form various elements necessary for the integrated circuit device. In example embodiments, the fine patterns 104P may be used for forming a lower electrode of a plurality of capacitors, which is formed in a cell array region of the integrated circuit device. In example embodiments, the fine patterns 104P formed by the method of manufacturing the integrated circuit device according to example embodiments may be used in a trimming process of defining a plurality of active regions in the cell array region of the integrated circuit device, a process of forming a plurality of direct contacts, and a process of a plurality buried contacts.

Figure 19:
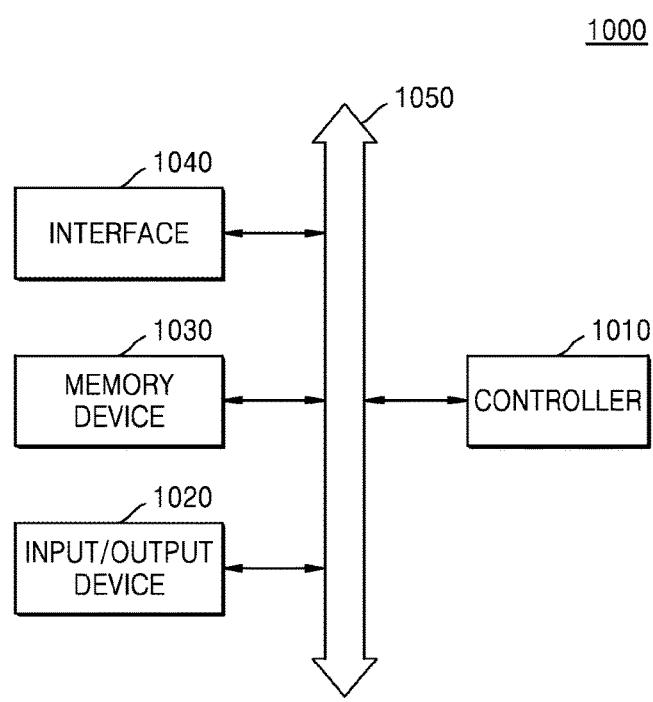
FIG. 19 is a block diagram of a system including an integrated circuit device, according to example embodiments.

FIG. 19 is a block diagram of a system 1000 including an integrated circuit device, according to example embodiments.

The system 1000 may include a controller 1010, an input/output device 1020, a memory device 1030, and an interface 1040. The system 1000 may be a mobile system or a system that transmits or receives information. In example embodiments, the mobile system may be a PDA, a portable computer, a web tablet, a wireless phone, a mobile phone, a digital music player, or a memory card. The controller 1010 may be a device for controlling an executive program in the system 1000 and may include a microprocessor, a digital signal processor, a microcontroller, or other devices similar to the microcontroller. The input/output device 1020 may be used to input or output data of the system 1000. The system 1000 may be connected to an external device, for example, a personnel computer or a network to exchange data with an external device by using the input/output device 1020. The input/output device 1020 may be, for example, a keypad, a keyboard, or a display.

The memory device 1030 may store a code or data for operating the controller 1010 or may store data processed in the controller 1010. The memory device 1030 may include at least one integrated circuit device manufactured by the method of manufacturing the integrated circuit device, according to example embodiments. For example, the memory device 1030 may include at least one integrated circuit device manufactured by the method of manufacturing the integrated circuit device described with reference to FIG. 18.

The interface 1040 may be a data transmission path between the system 1000 and external other devices. The controller 1010, the input/output device 1020, the memory device 1030, and the interface 1040 may communicate with one another through a bus 1050. The system 1000 may be used in a mobile phone, an MP3 player, a navigation device, a portable multimedia player (PMP), a solid state disk (SSD), or household appliances.

Figure 20:
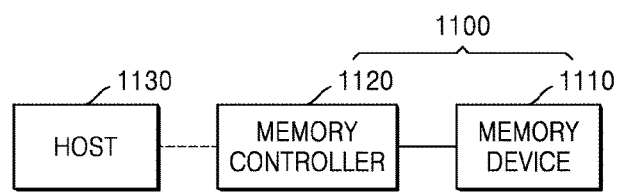
FIG. 20 is a block diagram of a memory card including an integrated circuit device, according to example embodiments.

FIG. 20 is a block diagram of a memory card 1100 including an integrated circuit device, according to example embodiments.

The memory card 1100 may include a memory device 1110 and a memory controller 1120. The memory device 1110 may store data. In example embodiments, the memory device 1110 may have non-volatile characteristics which are capable of retaining the stored data even when a power supply is cut off. The memory device 1110 may include at least one integrated circuit device manufactured by the method of manufacturing the integrated circuit device, according to example embodiments. For example, the memory device 1110 may include at least one integrated circuit device manufactured by the method of manufacturing the integrated circuit device described with reference to FIG. 18.

The controller 1120 may read the data stored in the memory device 1110 in response to a read/write request from a host 1130, or may store the data from the memory device 1110. The memory controller 1120 may include at least one integrated circuit device manufactured by the method of manufacturing the integrated circuit device, according to example embodiments. For example, the memory controller 1120 may include at least one integrated circuit device manufactured by the method of manufacturing the integrated circuit device described with reference to FIG. 18.

While the inventive concepts have been particularly shown and described with reference to example embodiments thereof, it will be understood that various changes in form and details may be made therein without departing from the spirit and scope of the following claims.

What is claimed is:

1. A block copolymer comprising:
a first polymer block and a second polymer block having different structures, one of the first polymer block and the second polymer block having a halogen-substituted structure; and
a random block copolymer connecting the first polymer block and the second polymer block, the random block copolymer having at least two repeating units that are randomly copolymerized,
wherein the random block copolymer is expressed by the following Formula (2):

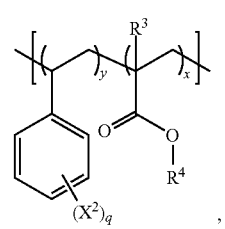

Formula (2)

wherein
$X^2$ is a halogen atom,
q is an integer from 1 to 5,
each of $R^3$ and $R^4$ is one of a hydrogen atom, a $C_1$-$C_5$ straight-chain or branched alkyl group, and a $C_1$-$C_5$ alkyl halide group, and
x/(x+y)=0.2 to 0.8.

2. The block copolymer of claim 1, wherein
the first polymer block and the second polymer block have different solubility parameters; and
the one of the first polymer block and the second polymer block having the halogen-substituted structure has a smaller solubility parameter.

3. The block copolymer of claim 1, wherein
the first polymer block includes a repeating unit derived from acrylic ester; and
the second polymer block includes a repeating unit having a halogen-substituted aromatic group.

4. The block copolymer of claim 1, wherein
the first polymer block includes a repeating unit derived from acrylic ester; and the second polymer block includes
- a first repeating unit derived from styrene, the first repeating unit including a halogen atom substituting at least one hydrogen atom at an α position of the styrene, or
- a second repeating unit derived from a derivative of styrene, the second repeating unit including a halogen atom substituting at least one hydrogen in a substituent at an α position of the derivative of the styrene.

5. The block copolymer of claim 1, wherein the block copolymer includes a structure of the following Formula (1):

Formula (1)

wherein
$X^1$ is a halogen atom,
p is an integer from 1 to 5,
each of $R^1$ and $R^2$ is one of a hydrogen atom, a $C_1$-$C_5$ straight-chain or branched alkyl group, and a $C_1$-$C_5$ alkyl halide group, and
$m/(m+n)=0.6$ to $0.8$.

6. The block copolymer of claim 1, further comprising:
a first end group connected to the first polymer block and a second end group connected to the second polymer block,
wherein one of the first end group and the second end group includes at least one of a dithioester end group and a trithiocarbonate end group.

7. A block copolymer comprising:
a first polymer block having a first solubility parameter; and
a second polymer block having a second solubility parameter less than the first solubility parameter, the second polymer block including a halogen-substituted structure; and
a random block copolymer connecting the first polymer block and the second polymer block, the random block copolymer having at least two repeating units that are randomly copolymerized,
wherein the random block copolymer is expressed by the following Formula (4):

Formula (4)

wherein
$X^3$ is a halogen atom,
r is an integer from 1 to 5,
each of $R^7$ and $R^8$ is one of a hydrogen atom, a $C_1$-$C_5$ straight-chain or branched alkyl group, and a $C_1$-$C_5$ alkyl halide group, and
$x/(x+y)=0.2$ to $0.8$.

8. The block copolymer of claim 7, wherein
the first polymer block includes a repeating unit derived from acrylic ester; and
the second polymer block includes a repeating unit including a halogen-substituted aromatic group.

9. The block copolymer of claim 7, wherein the block copolymer includes a structure of the following Formula (1):

Formula (1)

wherein
$X^1$ is a halogen atom,
p is an integer from 1 to 5,
each of $R^1$ and $R^2$ is one of a hydrogen atom, a $C_1$-$C_5$ straight-chain or branched alkyl group, and a $C_1$-$C_5$ alkyl halide group, and
$m/(m+n)=0.6$ to $0.8$.

10. The block copolymer of claim 7, wherein the block copolymer includes a structure of the following Formula (3):

Formula (3)

wherein
$X^1$ is a halogen atom,
p is an integer from 1 to 5,
each of $R^1$ and $R^2$ is one of a hydrogen atom, a $C_1$-$C_5$ straight-chain or branched alkyl group, and a $C_1$-$C_5$ alkyl halide group,
$R^5$ is a sulfur-containing functional group expressed by —S—(C=S)—R', where R' is one of a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, or a substituted or unsubstituted $C_6$-$C_{10}$ aryl group, $R^6$ is a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group, and
$m/(m+n)$=0.6 to 0.8.

11. The block copolymer of claim 7, wherein the block copolymer includes a structure of the following Formula (5):

Formula (5)

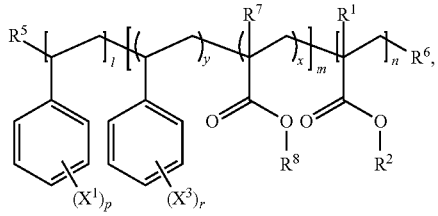

wherein
each of $X^1$ and $X^3$ is a halogen atom,
each of p and r is an integer from 1 to 5,
each of $R^1$, $R^2$, $R^7$, and $R^5$ is one of a hydrogen atom, a $C_1$-$C_5$ straight-chain or branched alkyl group, or a C1-$C_5$ alkyl halide group, and $R^5$ is a sulfur-containing functional group expressed by —S—(C=S)—R', where R' is a substituted or unsubstituted $C_1$-$C_{25}$ alkyl group, a substituted or unsubstituted $C_2$-$C_{25}$ alkenyl group, a substituted or unsubstituted $C_2$-$C_{25}$ alkynyl group, a substituted or unsubstituted phenyl group, a substituted or unsubstituted naphthyl group, a substituted or unsubstituted benzyl group, a substituted or unsubstituted $C_1$-$C_{25}$ alkylthio group, a substituted or unsubstituted $C_1$-$C_{25}$ alkoxy group, a substituted or unsubstituted $C_1$-$C_{25}$ alkylamino group, or a substituted or unsubstituted $C_6$-$C_{10}$ aryl group, $R^6$ is a hydrogen atom, a halogen atom, a substituted or unsubstituted $C_1$-$C_{25}$ alkyl group, a substituted or unsubstituted $C_1$-$C_{25}$ alkylthio group, a substituted or unsubstituted $C_6$-$C_{10}$ aryl group, a substituted or unsubstituted $C_6$-$C_{25}$ aryloxycarbonyl group, a carboxy group, a substituted or unsubstituted $C_1$-$C_{25}$ acyloxy group, a substituted or unsubstituted $C_1$-$C_{25}$ carbamoyl group, and a cyano group, $l/(l+m+n)$=0.6 to 0.8, $m/(l+m+n)$=0.01 to 0.15, and $x/(x+y)$=0.2 to 0.8.

12. A block copolymer comprising:
a first polymer block including at least one of poly(methyl methacrylate) (PMMA), poly(ethylene oxide) (PEO), poly(lactic acid) (PLA), and polyisoprene (PI);
a second polymer block including a halogen-substituted styrene; and
a random block copolymer connecting the first polymer block and the second polymer block, the random block copolymer having at least two repeating units that are randomly copolymerized.

13. The block copolymer of claim 12, wherein
the first polymer block is PMMA; and
the second polymer block is poly(fluorinated styrene) (PFS).

14. The block copolymer of claim 12, wherein the second polymer block has a smaller solubility parameter than the first polymer block.

15. The block copolymer of claim 12, further comprising:
a first end group connected to the first polymer block and a second end group connected to the second polymer block,
wherein one of the first end group and the second end group includes at least one of a dithioester end group and a trithiocarbonate end group.

* * * * *